(12) United States Patent
Sakakura et al.

(10) Patent No.: US 10,431,318 B2
(45) Date of Patent: Oct. 1, 2019

(54) SEMICONDUCTOR DEVICE

(71) Applicant: Semiconductor Energy Laboratory Co., Ltd., Atsugi-shi, Kanagawa-ken (JP)

(72) Inventors: Masayuki Sakakura, Isehara (JP); Yuugo Goto, Isehara (JP); Hiroyuki Miyake, Atsugi (JP); Daisuke Kurosaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/017,181

(22) Filed: Jun. 25, 2018

(65) Prior Publication Data
US 2018/0308558 A1 Oct. 25, 2018

Related U.S. Application Data

(63) Continuation of application No. 13/632,564, filed on Oct. 1, 2012, now Pat. No. 10,014,068.

(30) Foreign Application Priority Data

Oct. 7, 2011 (JP) .................................. 2011-222990

(51) Int. Cl.
*G11C 19/18* (2006.01)
*H01L 27/12* (2006.01)
*H01L 27/02* (2006.01)

(52) U.S. Cl.
CPC .......... *G11C 19/184* (2013.01); *H01L 27/124* (2013.01); *H01L 27/1222* (2013.01);
(Continued)

(58) Field of Classification Search
CPC . G09G 2310/02643; G09G 2310/0272; G09G 2310/0278; G09G 2310/0281;
(Continued)

(56) References Cited

U.S. PATENT DOCUMENTS

| 5,731,856 A | 3/1998 | Kim et al. |
| 5,744,820 A | 4/1998 | Matsushima et al. |

(Continued)

FOREIGN PATENT DOCUMENTS

| CN | 101887918 A | 11/2010 |
| CN | 102110685 A | 6/2011 |

(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — William Boddie
*Assistant Examiner* — Jeffrey Parker
(74) *Attorney, Agent, or Firm* — Robinson Intellectual Property Law Office; Eric J. Robinson

(57) ABSTRACT

A semiconductor device in which a decrease in the yield by electrostatic destruction can be prevented is provided. A scan line driver circuit for supplying a signal for selecting a plurality of pixels to a scan line includes a shift register for generating the signal. One conductive film functioning as respective gate electrodes of a plurality of transistors in the shift register is divided into a plurality of conductive films. The divided conductive films are electrically connected to each other by a conductive film which is formed in a layer different from the divided conductive films are formed. The plurality of transistors includes a transistor on an output side of the shift register.

6 Claims, 13 Drawing Sheets

(52) U.S. Cl.
CPC . *H01L 27/1225* (2013.01); *G09G 2310/0275* (2013.01); *G09G 2310/0286* (2013.01); *H01L 27/0248* (2013.01)

(58) Field of Classification Search
CPC ... G09G 2310/0286; G09G 2310/0294; G09G 3/3241; G09G 3/3266; G09G 3/3655; G09G 3/3674
See application file for complete search history.

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,690,442 B1 | 2/2004 | Kohtaka et al. |
| 6,727,522 B1 | 4/2004 | Kawasaki et al. |
| 6,825,488 B2 | 11/2004 | Yamazaki et al. |
| 6,836,301 B1 | 12/2004 | Kohtaka et al. |
| 6,882,377 B2 | 4/2005 | Kohtaka et al. |
| 7,049,190 B2 | 5/2006 | Takeda et al. |
| 7,053,890 B2 | 5/2006 | Inukai |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,224,629 B2 | 5/2007 | Akiyama et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishilh et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,492,655 B2 | 2/2009 | Akiyama et al. |
| 7,501,293 B2 | 3/2009 | Ito et al. |
| 7,511,687 B2 | 3/2009 | Kimura |
| 7,612,753 B2 | 11/2009 | Koyama |
| 7,667,272 B2 | 2/2010 | Hirose |
| 7,674,650 B2 | 3/2010 | Akimoto et al. |
| 7,732,819 B2 | 6/2010 | Akimoto et al. |
| 7,843,408 B2 | 11/2010 | Yamazaki et al. |
| 7,843,751 B2 | 11/2010 | Akiyama et al. |
| 7,910,490 B2 | 3/2011 | Akimoto et al. |
| 7,923,800 B2 | 4/2011 | Hirose et al. |
| 7,932,521 B2 | 4/2011 | Akimoto et al. |
| 7,978,274 B2 | 7/2011 | Umezaki et al. |
| 8,067,775 B2 | 11/2011 | Miyairi et al. |
| 8,199,596 B2 | 6/2012 | Akiyama et al. |
| 8,223,112 B2 | 7/2012 | Ohkawa et al. |
| 8,242,988 B2 | 8/2012 | Yamazaki et al. |
| 8,274,077 B2 | 9/2012 | Akimoto et al. |
| 8,344,992 B2 | 1/2013 | Koyama |
| 8,466,463 B2 | 6/2013 | Akimoto et al. |
| 8,471,620 B2 | 6/2013 | Koyama et al. |
| 8,518,739 B2 | 8/2013 | Miyairi et al. |
| 8,520,159 B2 | 8/2013 | Umezaki et al. |
| 8,531,376 B2 | 9/2013 | Shimoda |
| 8,570,256 B2 | 10/2013 | Yamazaki et al. |
| 8,624,656 B2 | 1/2014 | Koyama et al. |
| 8,629,069 B2 | 1/2014 | Akimoto et al. |
| 8,669,550 B2 | 3/2014 | Akimoto et al. |
| 8,717,262 B2 | 5/2014 | Koyama |
| 8,766,608 B2 | 7/2014 | Yamazaki et al. |
| 8,790,959 B2 | 7/2014 | Akimoto et al. |
| 8,796,069 B2 | 8/2014 | Akimoto et al. |
| 8,816,349 B2 | 8/2014 | Yamazaki et al. |
| 8,872,572 B2 | 10/2014 | Koyama et al. |
| 8,902,144 B2 | 12/2014 | Umezaki |
| 8,902,374 B2 | 12/2014 | Umezaki |
| 8,908,115 B2 | 12/2014 | Umezaki et al. |
| 9,029,851 B2 | 5/2015 | Miyairi et al. |
| 9,054,203 B2 | 6/2015 | Miyairi et al. |
| 9,099,562 B2 | 8/2015 | Akimoto et al. |
| 9,177,855 B2 | 11/2015 | Yamazaki et al. |
| 9,236,402 B2 | 1/2016 | Yamazaki et al. |
| 9,263,468 B2 | 2/2016 | Umezaki et al. |
| 9,263,476 B2 | 2/2016 | Koyama |
| 9,318,512 B2 | 4/2016 | Miyairi et al. |
| 9,337,184 B2 | 5/2016 | Umezaki |
| 9,368,519 B2 | 6/2016 | Koyama et al. |
| 9,601,603 B2 | 3/2017 | Miyairi et al. |
| 9,606,408 B2 | 3/2017 | Umezaki et al. |
| 9,830,878 B2 | 11/2017 | Koyama et al. |
| 9,934,747 B2 | 4/2018 | Koyama et al. |
| 10,014,068 B2 | 7/2018 | Sakakura et al. |
| 10,048,558 B2 | 8/2018 | Umezaki et al. |
| 10,153,380 B2 | 12/2018 | Miyairi et al. |
| 10,170,632 B2 | 1/2019 | Miyairi et al. |
| 2001/0017372 A1 | 8/2001 | Koyama |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0227746 A1 | 11/2004 | Shih |
| 2004/0252565 A1 | 12/2004 | Yamazaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237665 A1 | 10/2008 | Shishido |
| 2008/0254569 A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0270606 A1 | 10/2010 | Kutsukake et al. |
| 2010/0301326 A1 | 12/2010 | Miyairi et al. |
| 2011/0104851 A1 | 5/2011 | Akimoto et al. |
| 2011/0121290 A1 | 5/2011 | Akimoto et al. |
| 2012/0062529 A1 | 3/2012 | Koyama |
| 2012/0082287 A1 | 4/2012 | Moriwaki |
| 2012/0112191 A1 | 5/2012 | Kato et al. |
| 2012/0294061 A1 | 11/2012 | Nagatsuka et al. |
| 2012/0314482 A1 | 12/2012 | Takemura |
| 2013/0075732 A1 | 3/2013 | Saito et al. |
| 2015/0340513 A1 | 11/2015 | Akimoto et al. |
| 2016/0049520 A1 | 2/2016 | Yamazaki et al. |
| 2016/0247838 A1 | 8/2016 | Umezaki |
| 2016/0248044 A1 | 8/2016 | Koyama |
| 2018/0286343 A1 | 10/2018 | Koyama et al. |
| 2018/0348561 A1 | 12/2018 | Umezaki et al. |

FOREIGN PATENT DOCUMENTS

| | | |
|---|---|---|
| EP | 1130566 A | 9/2001 |
| EP | 1178462 A | 2/2002 |
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| EP | 2234116 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-152536 A | 6/1993 |
| JP | 05-251705 A | 9/1993 |
| JP | 08-236760 A | 9/1996 |
| JP | 08-262486 A | 10/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-082651 A | 3/2002 |
| JP | 2002-197885 A | 7/2002 |
| JP | 2002-289559 A | 10/2002 |
| JP | 2003-086000 A | 3/2003 |
| JP | 2003-086808 A | 3/2003 |
| JP | 2003-156764 A | 5/2003 |
| JP | 2004-103957 A | 4/2004 |
| JP | 2004-273614 A | 9/2004 |
| JP | 2004-273732 A | 9/2004 |
| JP | 2005-293759 A | 10/2005 |
| JP | 2006-229081 A | 8/2006 |
| JP | 2006-351165 A | 12/2006 |
| JP | 2007-096055 A | 4/2007 |
| JP | 2007-123861 A | 5/2007 |
| JP | 2008-107807 A | 5/2008 |
| JP | 2008-270757 A | 11/2008 |
| JP | 2010-123938 A | 6/2010 |
| JP | 2010-141308 A | 6/2010 |
| JP | 2010-152347 A | 7/2010 |
| JP | 2010-160494 A | 7/2010 |
| JP | 2010-258224 A | 11/2010 |
| JP | 2011-009734 A | 1/2011 |
| JP | 2011-087286 A | 4/2011 |
| JP | 2011-171703 A | 9/2011 |
| JP | 6515221 | 5/2019 |
| TV | 507258 | 10/2002 |
| TW | I242093 | 10/2005 |
| TW | 201034203 | 9/2010 |
| TW | 201131779 | 9/2011 |
| WO | WO-2004/114391 | 12/2004 |
| WO | WO-2009/084267 | 7/2009 |
| WO | WO-2010/047217 | 4/2010 |
| WO | WO-2010/061723 | 6/2010 |
| WO | WO-2011/043194 | 4/2011 |
| WO | WO-2011/052366 | 5/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 , SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al.,"42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-

(56) References Cited

OTHER PUBLICATIONS crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest Of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41 44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 in. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka,N et al., "SPINEL,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1230.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77. pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201210378806.5) dated Dec. 25, 2015.

Taiwanese Office Action (Application No. 105130197) dated Feb. 8, 2017.

Taiwanese Office Action (Application No. 105130197) dated Sep. 21, 2017.

Taiwanese Office Action (Application No. 105130197) dated Dec. 11, 2018.

Korean Office Action (Application No. 2012-0111243) dated Sep. 5, 2018.

SEMICONDUCTOR DEVICE

BACKGROUND OF THE INVENTION

1. Field of the Invention

The present invention relates to a semiconductor device using an insulated gate field-effect transistor.

2. Description of the Related Art

In recent years, a metal oxide having semiconductor characteristics, which is called an oxide semiconductor, has attracted attention as a novel semiconductor material having both high mobility like the mobility of polycrystalline silicon or microcrystalline silicon and uniform element characteristics like the element characteristics of amorphous silicon. The metal oxide has been used for various applications; for example, indium oxide, which is a well-known metal oxide, has been used as a material of a transparent electrode for a liquid crystal display device or the like. Examples of such a metal oxide having semiconductor characteristics include tungsten oxide, tin oxide, indium oxide, and zinc oxide. Transistors in each of which a channel formation region is formed using such a metal oxide having semiconductor characteristics are known (Patent Documents 1 and 2).

REFERENCE

Patent Document 1: Japanese Published Patent Application No. 2007-123861
Patent Document 2: Japanese Published Patent Application No. 2007-096055

SUMMARY OF THE INVENTION

Transistors using amorphous silicon or an oxide semiconductor enable a semiconductor display device to be manufactured over a glass substrate of fifth generation (1200 mm wide×1300 mm long) or greater generation, whereby advantages of high productivity and low cost are provided. As the panel size is increased, a load of a wiring called a bus line, which is connected to a plurality of pixels, e.g., a scan line or a signal line increases in a pixel portion of the semiconductor display device. Thus, the requisite current supply ability of a driver circuit for supplying a potential to the scan line or the signal line is increased, and accordingly, the size of a transistor included in the driver circuit, particularly a transistor on the output side of the driver circuit tends to be increased with an increase in the size of the panel, though depending on electrical characteristics of the transistor.

Such an increase in the size of the transistor leads to an increase in the area of a wiring which functions as a gate electrode of the transistor in the driver circuit in view of the layout. Therefore, a so-called antenna effect, a phenomenon in which charge is accumulated in a wiring in a manufacturing step using plasma, such as dry etching, is likely to occur, which increases the probability of electrostatic destruction of the wiring by discharge of the charge accumulated in the wiring.

In particular, the on-state current of the transistor using amorphous silicon or an oxide semiconductor tends to be smaller than that of a transistor using polycrystalline silicon or single crystal silicon. Therefore, although the transistor using amorphous silicon or an oxide semiconductor enables fabrication for a larger panel in the process, such a larger panel necessitates a transistor designed to have a larger size to meet the current supply ability of the driver circuit. Thus, the probability of electrostatic destruction of the wiring by an increase in the area of the wiring increases, so that the yield tends to decrease.

In view of the above-described technical background, one object of one embodiment of the present invention is to provide a semiconductor device in which a decrease in the yield by electrostatic destruction can be prevented.

In one embodiment of the present invention, one conductive film functioning as respective gate electrodes of a plurality of transistors is divided into a plurality of conductive films in order to prevent accumulation of charge in the conductive film by an antenna effect. The divided conductive films are spaced from each other. Further, the divided conductive films are electrically connected to each other by a conductive film which is different from the divided conductive films. The plurality of transistors includes a transistor on an output side of a driver circuit.

In one embodiment of the present invention, a scan line driver circuit for supplying a signal for selecting a plurality of pixels to a scan line includes a shift register for generating the signal. One conductive film functioning as respective gate electrodes of a plurality of transistors in the shift register is divided into a plurality of conductive films. The divided conductive films are spaced from each other. Further, the divided conductive films are electrically connected to each other by a conductive film which is different from the divided conductive films. The plurality of transistors includes a transistor on an output side of the shift register.

The conductive film which is different from the divided conductive films may be provided in a layer different from the divided conductive films, so that the conductive film and respective source and drain electrodes of the plurality of transistors may be provided in the same layer.

In one embodiment of the present invention, the plurality of transistors may include amorphous silicon or an oxide semiconductor in their active layers.

In accordance with one embodiment of the present invention, by electrically connecting the plurality of conductive films, which function as the gate electrodes, to each other by the conductive film provided in the different layer, the area of each conductive film which functions as a gate electrode can be reduced to be smaller than that of one conductive film which functions as respective gate electrodes of a plurality of transistors. Accordingly, even when the size of the transistor on the output side of the driver circuit is increased by an increase in the panel size, the area of the conductive film which functions as the gate electrode of the transistor can be suppressed to be small, whereby the conductive film can be prevented from being damaged by static electricity due to an antenna effect in a manufacturing step using plasma, such as a step for forming a gate electrode by etching.

Specifically, a semiconductor device according to one embodiment of the present invention includes a driver circuit for supplying signals to a plurality of pixels. The driver circuit includes a plurality of transistors. Of the plurality of transistors, a gate electrode of at least one transistor on a signal output side is electrically connected to a gate electrode of at least other one transistor by a conductive film which is different from the gate electrodes.

With the above-described structure, the semiconductor device according to one embodiment of the present invention makes it possible to prevent reduction in yield by electrostatic destruction.

DETAILED DESCRIPTION OF THE INVENTION

Hereinafter, embodiments of the present invention are described in detail with reference to the accompanying drawings. However, the present invention is not limited to the following description and it will be easily understood by those skilled in the art that the mode and details can be variously changed without departing from the scope and spirit of the present invention. Accordingly, the present invention should not be construed as being limited to the description of the embodiments below.

The present invention encompasses in its category, any semiconductor device using a transistor, such as an integrated circuit, an RF tag, and a semiconductor device. The integrated circuit includes in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). In addition, the semiconductor display devices include the following in its category: liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a circuit element using a semiconductor film is included in a driver circuit.

In this specification, the semiconductor display device includes in its category, panels in which a display element such as a liquid crystal element or a light-emitting element is provided for each pixel, and modules in which an IC or the like including a controller is mounted on the panel.

Embodiment 1

Figure 1:
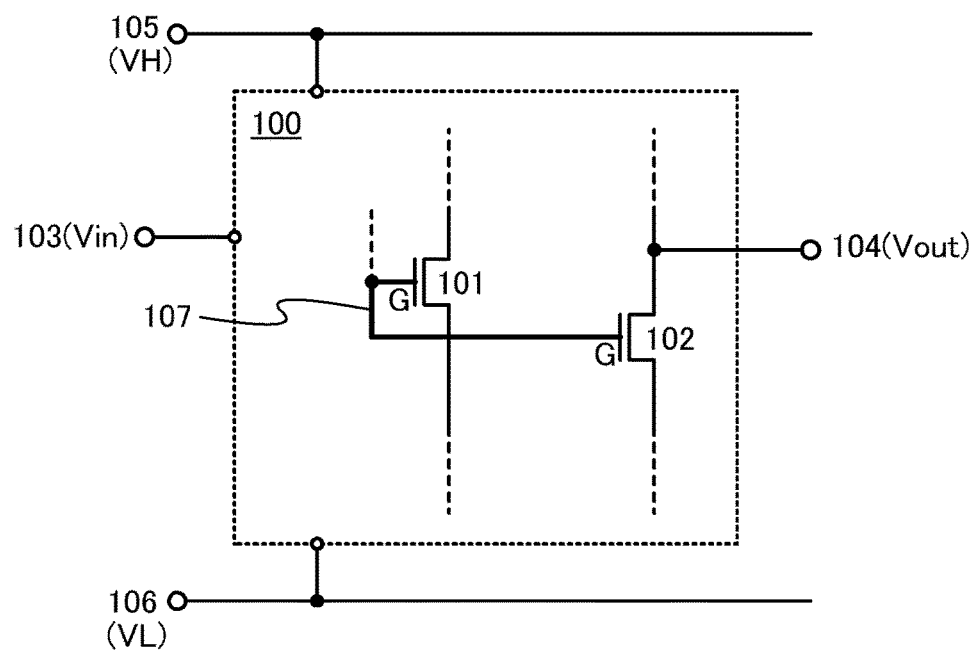
FIG. 1 is a diagram showing a configuration of a semiconductor device of the present invention.

FIG. 1 illustrates an example of a circuit configuration of a semiconductor device according to one embodiment of the present invention. A semiconductor device 100 shown in FIG. 1 includes a plurality of transistors including at least a transistor 101 and a transistor 102.

A high-level potential VH and a low-level potential VL are applied to the semiconductor device 100 through a wiring 105 and a wiring 106. In FIG. 1, the potential VH is applied to the semiconductor device 100 through the wiring 105, and the potential VL is applied to the semiconductor device 100 through the wiring 106. Further, a potential Vin of an input signal is applied to semiconductor device 100 through a wiring 103. In the semiconductor device 100, the plurality of transistors including the transistor 101 and the transistor 102 is turned on or off in accordance with the potential Vin. Consequently, one of the potentials VH and VL is selected by the above-described switching operation, so that the selected potential is output as a potential Vout of an output signal from the semiconductor device 100 through a wiring 104.

One of a source terminal and a drain terminal of the transistor 102 is connected to the wiring 104. That is, the transistor 102 is positioned on an output side of the semiconductor device 100 and has a function of controlling an output of the potential Vout to the wiring 104. In one embodiment of the present invention, a gate electrode (G) of the transistor 101 is electrically connected to a gate electrode (G) of the transistor 102 by a wiring 107 which is different from the gate electrodes.

In this specification, the term "connection" means both of electrical connection and direct connection unless otherwise specified, and corresponds to a state in which current, voltage, or a potential can be supplied or transmitted. Therefore, the state of "connection" does not necessarily mean the state of direct connection, but includes in its category, the state of indirect connection through an element such as a wiring, a conductive film, a resistor, a diode, or a transistor so that current, voltage, or a potential can be supplied or transmitted.

In addition, the "source terminal" of the transistor means a source region that is a part of an active layer or a source electrode connected to an active layer. Similarly, the "drain terminal" of the transistor means a drain region that is a part of an active layer or a drain electrode connected to an active layer.

The terms "source terminal" and "drain terminal" of the transistor interchange with each other depending on the polarity of the transistor and which one of respective potentials applied to the terminals is high or low. In general, in an n-channel transistor, an electrode to which a low potential is applied is called a source terminal, and an electrode to which a high potential is applied is called a drain terminal. In contrast, in a p-channel transistor, an electrode to which a low potential is applied is called a drain terminal, and an electrode to which a high potential is applied is called a source terminal. In this specification, although the connection relation of a transistor is described assuming that the source terminal and the drain terminal are fixed in some cases for convenience, actually, the source terminal and the drain terminal are interchangeably used in accordance with the above-described relation of the potentials.

In the case where the potential Vout output from semiconductor device 100 is applied to a heavily-loaded wiring called a bus line, such as a scan line or a signal line, which is connected to a plurality of pixels, the transistor 102 for controlling the output of the potential Vout needs to have high current supply ability. Thus, it is preferable to design the transistors 101 and 102 such that the channel width W of the transistor 102 is larger than the channel width W of the transistor 101.

Figure 2A:
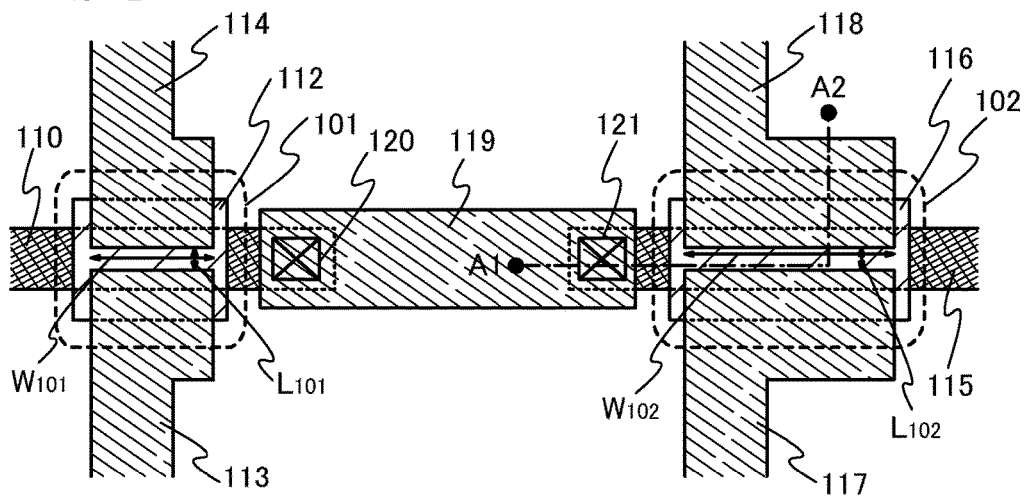
FIGS. 2A and 2C are top views of transistors.

FIG. 2A is an example of a top view of the transistors 101 and 102 shown in FIG. 1. In the top view in FIG. 2A, however, a gate insulating film 111 is omitted for clarifying the layout of the transistors 101 and 102. Further, FIG. 2B is an example of a cross-sectional view along a dashed-dotted line A1-A2 of the transistor 102 in FIG. 2A.

In FIG. 2A, the transistor 101 includes a conductive film 110 which functions as a gate electrode, the gate insulating film 111 over the conductive film 110, a semiconductor film 112 provided to overlap with the conductive film 110 over the gate insulating film 111, and a conductive film 113 and a conductive film 114 which function as a source electrode and a drain electrode over the semiconductor film 112.

Figure 2B:
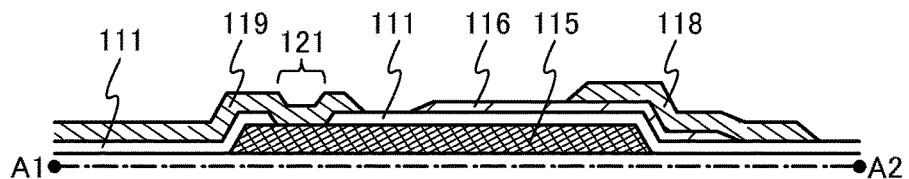
FIG. 2B is a cross-sectional view of the transistor.

Further, in FIGS. 2A and 2B, the transistor 102 includes a conductive film 115 which functions as a gate electrode, the gate insulating film 111 over the conductive film 115, a semiconductor film 116 provided to overlap with the conductive film 115 over the gate insulating film 111, and a conductive film 117 and a conductive film 118 which function as a source electrode and a drain electrode over the semiconductor film 116.

Further, in one embodiment of the present invention, the current supply ability of the transistor 102 positioned on the output side is higher than that of the transistor 101. Therefore, in one embodiment of the present invention, as shown in FIG. 2A, it is preferable to design the transistors 101 and 102 such that the ratio of a channel width $W_{102}$ to a channel length $L_{102}$ of the transistor 102 is larger than the ratio of a channel width $W_{101}$ to a channel length $L_{101}$ of the transistor 101. Specifically, the ratio of the channel width $W_{102}$ to the channel length $L_{102}$ is preferably twice or more as large as the ratio of the channel width $W_{101}$ to the channel length $L_{101}$, further preferably three times or more as large as the ratio of the channel width $W_{101a}$ to the channel length $L_{101}$.

Further, the conductive film 110 is spaced from the conductive film 115. In this specification, being "spaced" means to be positioned with a physical distance. Further, in FIGS. 2A and 2B, the conductive film 110 is electrically connected to the conductive film 115 by a conductive film 119 which functions as a wiring. Specifically, the conductive film 110 is connected to the conductive film 119 in an opening 120 formed in the gate insulating film 111, and the conductive film 115 is connected to the conductive film 119 in an opening 121 formed in the gate insulating film 111.

Further, the conductive films 110 and 115 shown in FIGS. 2A and 2B can be formed by processing one conductive film formed over an insulating surface into an appropriate shape by etching or the like. The conductive films 113 and 114, the conductive films 117 and 118, and the conductive film 119 can be formed by processing one conductive film which is formed over the gate insulating film 111 to cover the openings 120 and 121, into an appropriate shape by etching or the like. That is, the conductive film 119 is formed in a layer different from the conductive films 110 and 115.

As shown in FIGS. 2A and 2B, in one embodiment of the present invention, the conductive films 110 and 115, which function as the gate electrodes, are electrically connected to each other by the conductive film 119 formed in the layer different from the layer of the conductive films 110 and 115.

Figure 2C:
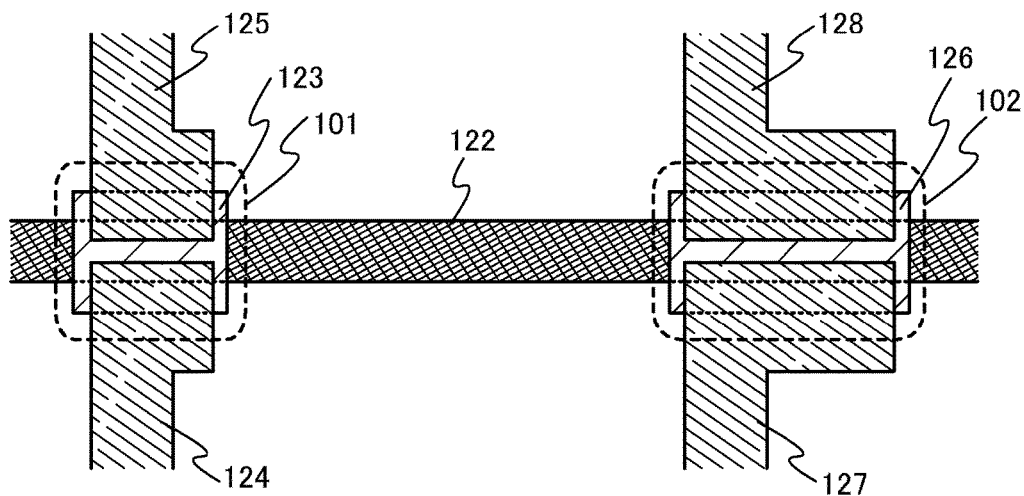

As a comparison example, FIG. 2C illustrates another example of the top view of the transistors 101 and 102 shown in FIG. 1. In the top view in FIG. 2C, however, a gate insulating film is omitted for clarifying the layout of the transistors 101 and 102.

In FIG. 2C, the transistor 101 includes a conductive film 122 which functions as a gate electrode, a gate insulating film over the conductive film 122, a semiconductor film 123 provided to overlap with the conductive film 122 over the gate insulating film, and a conductive film 124 and a conductive film 125 which function as a source electrode and a drain electrode over the semiconductor film 123.

Further, in FIG. 2C, the transistor 102 includes the conductive film 122 which functions as a gate electrode, a gate insulating film over the conductive film 122, a semiconductor film 126 provided to overlap with the conductive film 122 over the gate insulating film, and a conductive film 127 and a conductive film 128 which function as a source electrode and a drain electrode over the semiconductor film 126.

That is, in FIG. 2C, the conductive film 122 is shared between the transistors 101 and 102; the conductive film 122 functions both as the gate electrode of the transistor 101 and as the gate electrode of the transistor 102. Thus, the area of the conductive film 122, which functions as the gate electrodes in FIG. 2C, is larger than any of respective areas of the conductive films 110 and 115, which function as the gate electrodes in FIGS. 2A and 2B.

Therefore, in one embodiment of the present invention, since each of the areas of the conductive films 110 and 115, which function as the gate electrodes, can be suppressed to be smaller than that of the conductive film 122 in the comparison example, the amount of charge accumulated in each of the conductive films 110 and 115 in etching for forming the conductive films 110 and 115 can be suppressed to be small, i.e., an antenna effect can be reduced. Accordingly, in one embodiment of the present invention, electrostatic destruction of the conductive films 110 and 115 by discharge of the above-described charge can be less likely to occur in forming the conductive films 110 and 115 with use of etching, than in the comparison example.

Furthermore, in one embodiment of the present invention, electrostatic destruction of the conductive films 110 and 115 by an antenna effect can also be less likely to occur in forming the semiconductor film 112 over the conductive film 110 and the semiconductor film 116 over the conductive film 115 with use of etching.

Figure 3A:
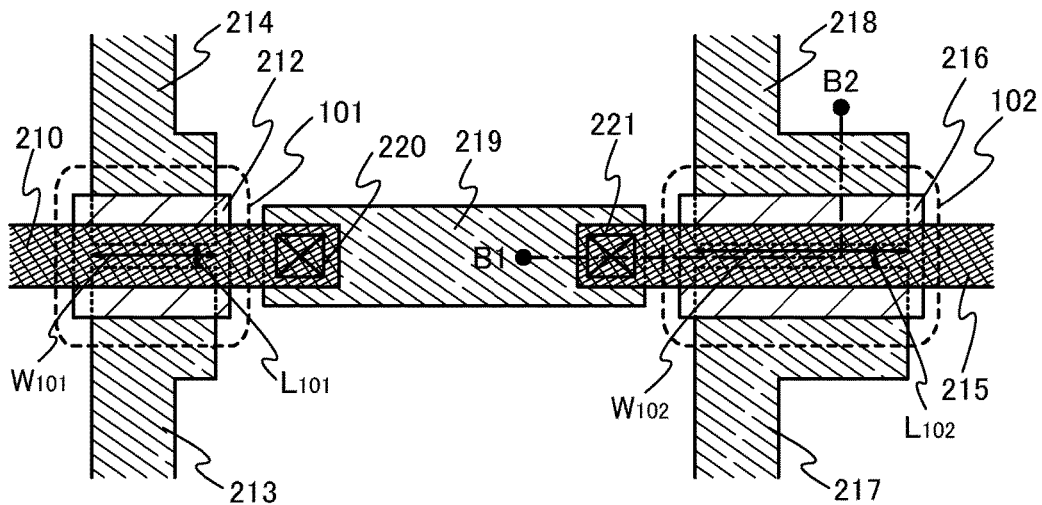
FIGS. 3A and 3C are top views of transistors.

Next, FIG. 3A illustrates an example of the top view of the transistors 101 and 102 shown in FIG. 1, which is different from the example shown in FIG. 2A. In the top view in FIG. 3A, however, a gate insulating film 211 is omitted for clarifying the layout of the transistors 101 and 102. Further, FIG. 3B is an example of a cross-sectional view along a dashed-dotted line B1-B2 of the transistor 102 in FIG. 3A.

In FIG. 3A, the transistor 101 includes a conductive film 213 and a conductive film 214 which function as a source electrode and a drain electrode, a semiconductor film 212 over the conductive films 213 and 214, the gate insulating film 211 over the semiconductor film 212, and a conductive film 210 which functions as a gate electrode and is provided to overlap with the semiconductor film 212 over the gate insulating film 211.

Figure 3B:
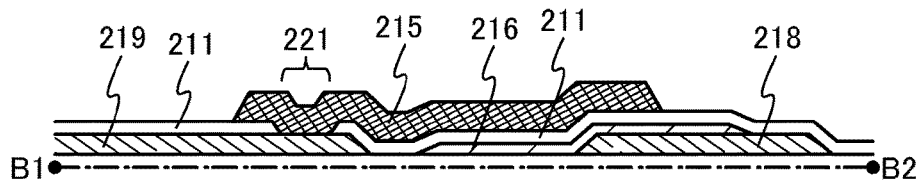
FIG. 3B is a cross-sectional view of the transistor.

In FIGS. 3A and 3B, the transistor 102 includes a conductive film 217 and a conductive film 218 which function as a source electrode and a drain electrode, a semiconductor film 216 over the conductive films 217 and 218, the gate insulating film 211 over the semiconductor film 216, and a conductive film 215 which functions as a gate electrode and is provided to overlap with the semiconductor film 216 over the gate insulating film 211.

Further, in one embodiment of the present invention, the current supply ability of the transistor 102 positioned on the output side is higher than that of the transistor 101. Therefore, in one embodiment of the present invention, as shown in FIG. 3A, it is preferable to design the transistors 101 and 102 such that the ratio of a channel width $W_{102}$ to a channel length $L_{102}$ of the transistor 102 is larger than the ratio of a channel width $W_{101}$ to a channel length $L_{101}$ of the transistor 101. Specifically, the ratio of the channel width $W_{102}$ to the channel length $L_{102}$ is preferably twice or more as larger as the ratio of the channel width $W_{101}$ to the channel length $L_{101}$, further preferably three or more times as large as the ratio of the channel width $W_{101}$ to the channel length $L_{101}$.

Further, the conductive film 210 is spaced from the conductive film 215. Further, in FIGS. 3A and 3B, the conductive film 210 is electrically connected to the conductive film 215 by a conductive film 219 which functions as a wiring. Specifically, the conductive film 210 is connected to the conductive film 219 in an opening 220 formed in the gate insulating film 211, and the conductive film 215 is connected to the conductive film 219 in an opening 221 formed in the gate insulating film 211.

Further, the conductive films 210 and 215 shown in FIGS. 3A and 3B can be formed by processing one conductive film formed over the gate insulating film 211 to cover the openings 220 and 221, into an appropriate shape by etching or the like. The conductive films 213 and 214, the conductive films 217 and 218, and the conductive film 219 can be formed by processing one conductive film which is formed over an insulating surface, into an appropriate shape by etching or the like. That is, the conductive film 219 is formed in a layer different from the conductive films 210 and 215.

As shown in FIGS. 3A and 3B, in one embodiment of the present invention, the conductive films 210 and 215, which function as the gate electrodes, are electrically connected to each other by the conductive film 219 formed in the layer different from the layer of the conductive films 210 and 215.

Figure 3C:
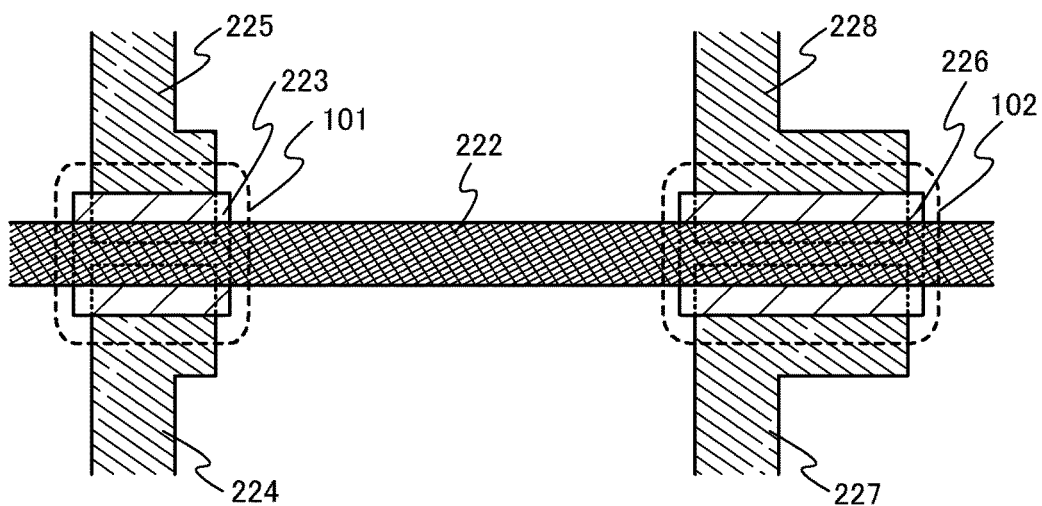

As a comparison example, FIG. 3C illustrates another example of the top view of the transistors 101 and 102 shown in FIG. 1. In the top view in FIG. 3C, however, a gate insulating film is omitted for clarifying the layout of the transistors 101 and 102.

In FIG. 3C, the transistor 101 includes a conductive film 224 and a conductive film 225 which function as a source electrode and a drain electrode, a semiconductor film 223 over the conductive films 224 and 225, a gate insulating film over the semiconductor film 223, and a conductive film 222 which functions as a gate electrode and is provided to overlap with the semiconductor film 223 over the gate insulating film.

Further, in FIG. 3C, the transistor 102 includes a conductive film 227 and a conductive film 228 which function as a source electrode and a drain electrode, a semiconductor film 226 over the conductive films 227 and 228, a gate insulating film over the semiconductor film 226, and the conductive film 222 which functions as a gate electrode and is provided to overlap with the semiconductor film 226 over the gate insulating film.

That is, in FIG. 3C, the conductive film 222 is shared between the transistors 101 and 102; the conductive film 222 functions both as the gate electrode of the transistor 101 and as the gate electrode of the transistor 102. Thus, the area of the conductive film 222, which functions as the gate electrodes in FIG. 3C, is larger than any of respective areas of the conductive films 210 and 215, which function as the gate electrodes in FIGS. 3A and 3B.

Therefore, in one embodiment of the present invention, since each of the areas of the conductive films 210 and 215, which function as the gate electrodes, can be suppressed to be smaller than that of the conductive film 222 in the comparison example, the amount of charge accumulated in each of the conductive films 210 and 215 in etching for forming the conductive films 210 and 215 can be suppressed to be small, i.e., an antenna effect can be reduced. Accordingly, in one embodiment of the present invention, electrostatic destruction of the conductive films 210 and 215 by discharge of the above-described charge can be less likely to occur in forming the conductive films 210 and 215 with use of etching, than in the comparison example.

Furthermore, in one embodiment of the present invention, electrostatic destruction of the conductive films 210 and 215 by an antenna effect can also be less likely to occur in processing any conductive film over the conductive films 210 and 215 into an appropriate shape by etching.

Figure 4:
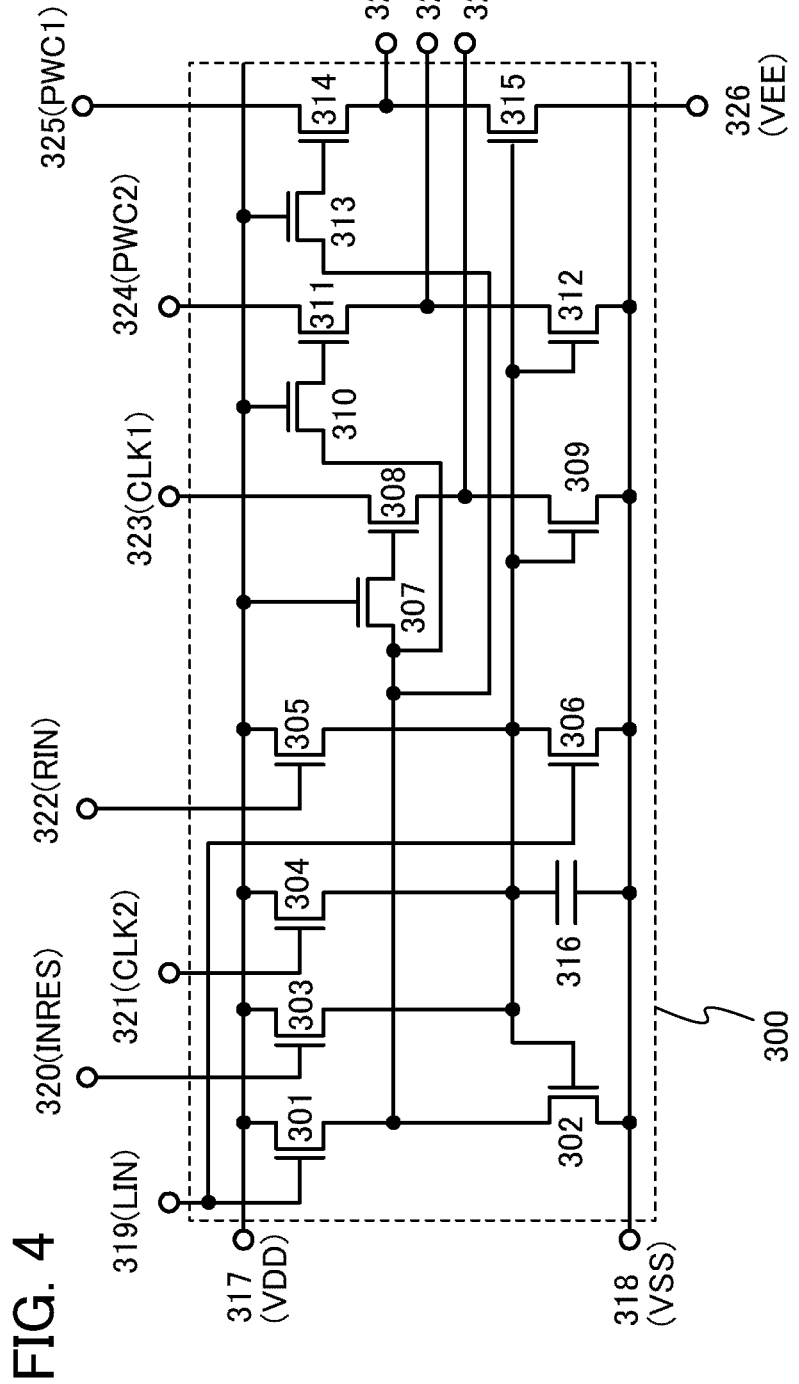
FIG. 4 is a circuit diagram illustrating a configuration of a semiconductor device of the present invention.

Next, a pulse generator which is a semiconductor device according to one embodiment of the present invention is described. FIG. 4 illustrates an example of a pulse generator for a semiconductor device according to one embodiment of the present invention.

A pulse generator 300 illustrated in FIG. 4 includes transistors 301 to 315 and a capacitor 316. The transistor 302 corresponds to the transistor 101 shown in FIG. 1. Each of the transistors 309, 312, and 315 corresponds to the transistor 102 shown in FIG. 1. The pulse generator 300 is applied with a variety of potentials from wirings 317 to 326, and outputs potentials to wirings 327 to 329.

A shift register can be constituted by connecting the plurality of pulse generators 300 in series.

Specifically, in the case where the transistors 301 to 315 are n-channel transistors, a high-level potential VDD, a low-level potential VSS, and a low-level potential VEE are applied to the wiring 317, the wiring 318, and the wiring 326, respectively. The potential VEE is preferably equal to or higher than the potential VSS. Further, a potential LIN is applied to the wiring 319, a potential INRES is applied to the wiring 320, a potential CLK2 is applied to the wiring 321, a potential RIN is applied to the wiring 322, a potential CLK1 is applied to the wiring 323, a potential PWC2 is applied to the wiring 324, and a potential PWC1 is applied to the wiring 325.

Further, a potential GOUT1 output from the pulse generator 300 is applied to the wiring 327. A potential GOUT2 output from the pulse generator 300 is applied to the wiring 328. A potential SROUT output from the pulse generator 300 is applied to the wiring 329.

The potentials LIN, RIN, CLK2, and INRES each correspond to the potential Vin in the semiconductor device 100 illustrated in FIG. 1. The potentials GOUT1, GOUT2, and SROUT each correspond to the potential Vout in the semiconductor device 100 illustrated in FIG. 1. The potentials VSS, VEE, PWC1, PWC2, and CLK1 each correspond to either the potential VH or the potential VL in the semiconductor device 100 illustrated in FIG. 1.

Specifically, a gate electrode of the transistor 301 is connected to the wiring 319; one of a source and drain terminals of the transistor 301 is connected to the wiring 317; and the other of the source and drain terminals of the transistor 301 is connected to one of a source and drain terminals of the transistor 302. A gate electrode of the transistor 302 is connected to a gate electrode of the transistor 315; and the other of the source and drain terminals of the transistor 302 is connected to the wiring 318. A gate electrode of the transistor 303 is connected to the wiring 320; one of a source and drain terminals of the transistor 303 is connected to the wiring 317; and the other of the source and drain terminals of the transistor 303 is connected to the gate electrode of the transistor 302. A gate electrode of the transistor 304 is connected to the wiring 321; one of a source and drain terminals of the transistor 304 is connected to the wiring 317; and the other of the source and drain terminals of the transistor 304 is connected to the gate electrode of the transistor 302. A gate electrode of the transistor 305 is connected to the wiring 322; one of a source and drain terminals of the transistor 305 is connected to the wiring 317; and the other of the source and drain terminals of the transistor 305 is connected to the gate electrode of the transistor 302. A gate electrode of the transistor 306 is connected to the wiring 319; one of a source and drain terminals of the transistor 306 is connected to the gate electrode of the transistor 302; and the other of the source and drain terminals of the transistor 306 is connected to the wiring 318. A gate electrode of the transistor 307 is connected to the wiring 317; one of a source and drain terminals of the transistor 307 is connected to the other of the source and drain terminals of the transistor 301; and the other of the source and drain terminals of the transistor 307 is connected to a gate electrode of the transistor 308. One of a source and drain terminals of the transistor 308 is connected to the wiring 323; and the other of the source and drain terminals of the transistor 308 is connected to the wiring 329. A gate electrode of the transistor 309 is connected to the gate electrode of the transistor 302; one of a source and drain terminals of the transistor 309 is connected to the wiring 329; and the other of the source and drain terminals of the transistor 309 is connected to the wiring 318. A gate electrode of the transistor 310 is connected to the wiring 317; one of a source and drain terminals of the transistor 310 is connected to the other of the source and drain terminals of the transistor 301; and the other of the source and drain terminals of the transistor 310 is connected to a gate electrode of the transistor 311. One of a source and drain terminals of the transistor 311 is connected to the wiring 324; and the other of the source and drain terminals of the transistor 311 is connected to the wiring 328. A gate electrode of the transistor 312 is connected to the gate electrode of the transistor 302; one of a source and drain terminals of the transistor 312 is connected to the wiring 328; and the other of the source and drain terminals of the transistor 312 is connected to the wiring 318. A gate electrode of the transistor 313 is connected to the wiring 317; one of a source and drain terminals of the transistor 313 is connected to the other of the source and drain terminals of the transistor 301; and the other of the source and drain terminals of the transistor 313 is connected to a gate electrode of the transistor 314. One of a source and drain terminals of the transistor 314 is connected to the wiring 325; and the other of the source and drain terminals of the transistor 314 is connected to the wiring 327. One of a source and drain terminals of the transistor 315 is connected to the wiring 327; and the other of the source and drain terminals of the transistor 315 is connected to the wiring 326. One electrode of the capacitor 316 is connected to the gate electrode of the transistor 302; and the other electrode of the capacitor 316 is connected to the wiring 318.

The other of the source and drain terminals of the transistor 315 on the output side is connected to the wiring 326 in FIG. 4; however, embodiments of the present invention are not limited thereto. The other of the source and drain terminals of the transistor 315 on the output side may be connected to the wiring 318. However, the size of the transistor 315 on the output side is larger, and therefore, in the case where the transistor 315 is a normally-on transistor, the drain current of the transistor 315 is larger than that in the off state of any other transistor. Therefore, in the case where the transistor 315 is a normally-on transistor, when the other of the source and drain terminals of the transistor 315 is connected to the wiring 318, the potential of the wiring 318 is likely to be increased by the above-described drain current, resulting in reduction in the amplitude of the potential GOUT1 that is an output potential. On the other hand, when the other of the source and drain terminals of the transistor 315 on the output side is connected not to the wiring 318 but to the wiring 326 as shown in FIG. 4, even in the case where the transistor 315 is a normally-on transistor and accordingly the potential of the wiring 326 is increased, the potential of the wiring 318 for applying the potential to the gate electrode of the transistor 315 is unrelated to the increase in the potential of the wiring 326; accordingly, as the potential of the wiring 326 increases due to the drain current of the transistor 315, the gate voltage of the transistor 315 decreases toward the threshold voltage which is a negative voltage, so that the transistor 315 can be turned off even in the case where the transistor 315 is a normally-on transistor.

In one embodiment of the present invention, at least one of their respective gate electrodes of the transistors 309, 312, and 315 which correspond to transistors on the output side is electrically connected to the gate electrode of the transistor 302 by a conductive film which is different from these gate electrodes. This structure enables the area of each conductive film which functions as the gate electrode to be smaller than that in the case where all of their respective gate electrodes of the transistors 309, 312, 315, and 302 are formed of one conductive film. Accordingly, electrostatic destruction attributed to an antenna effect of the conductive film which functions as a gate electrode can be less likely to occur.

One embodiment of the present invention is not limited to a structure in which two conductive films each of which functions as a gate electrode are electrically connected to each other by one conductive film which is different from the two conductive films. For example, two conductive films each of which functions as a gate electrode may be electrically connected to each other by a plurality of conductive films which are different from the two conductive films. In that case, at least one of the plurality of conductive films is formed in a layer which is different from the two conductive films each of which functions as a gate electrode.

Further, one embodiment of the present invention is not limited to a structure in which an insulating film is provided between a plurality of conductive films each of which functions as a gate electrode and a conductive film for electrically connecting the plurality of conductive films to each other. In one embodiment of the present invention, a plurality of conductive films each of which functions as a gate electrode is formed in a formation step different from that of a conductive film for electrically connecting the plurality of conductive films to each other. Thus, an insulating film is not necessarily provided between the plurality of conductive films each of which functions as a gate electrode and the conductive film for electrically connecting the plurality of conductive films to each other.

Embodiment 2

In this embodiment, a shift register constituted by connecting the plurality of pulse generators 300 illustrated in FIG. 4 in series is described.

Figure 5:
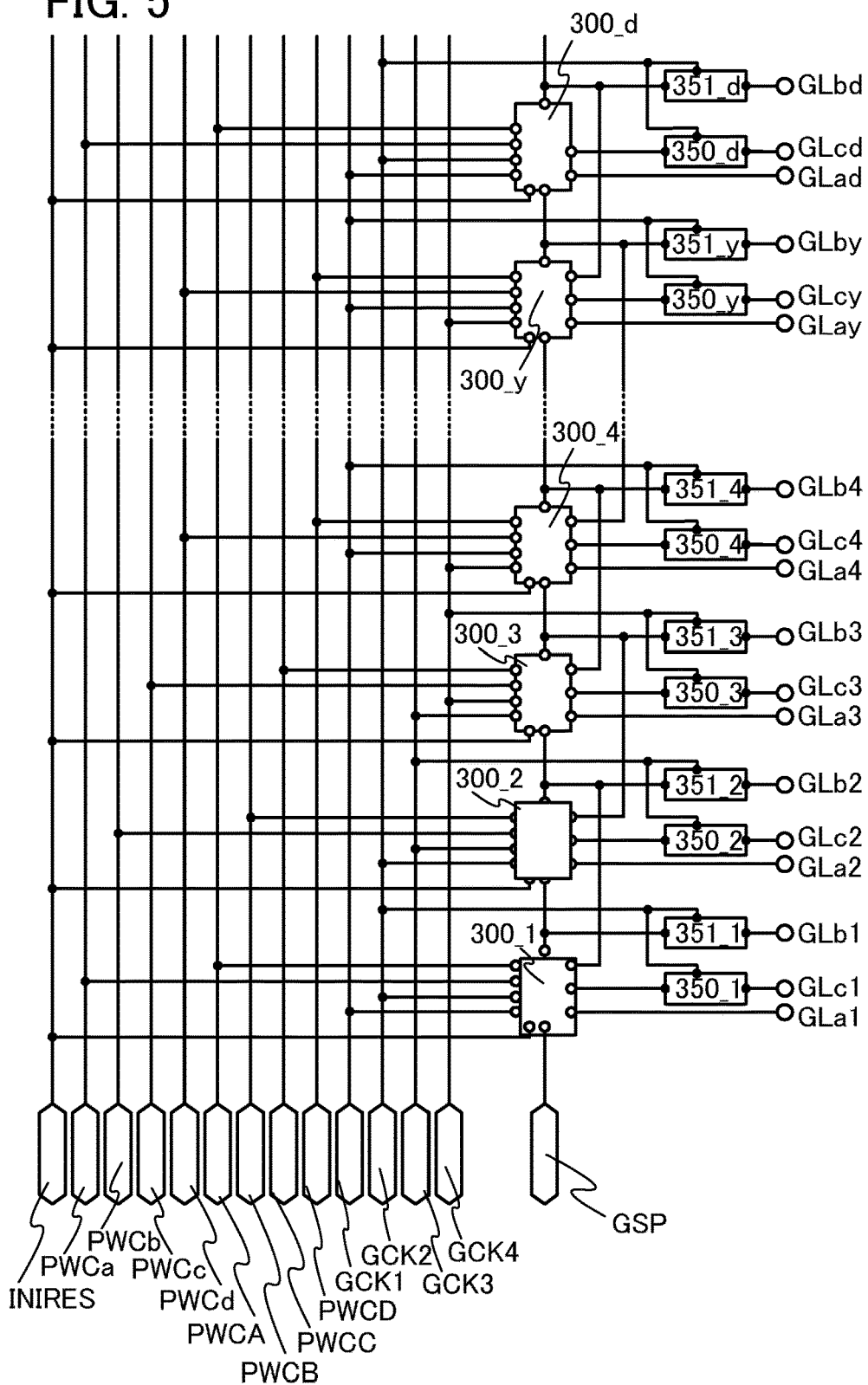
FIG. 5 is a diagram illustrating a structure of a shift register.

A shift register illustrated in FIG. 5 includes pulse generators 300_1 to 300_$y$ (y is a natural number) and a dummy pulse generator 300_d. The pulse generators 300_1 to 300_y each have a configuration which is the same as that of the pulse generator 300 illustrated in FIG. 4. On the other hand, the configuration of the pulse generator 300_d is different from that of the pulse generator 300 illustrated in FIG. 4 in that the pulse generator 300_d is not connected to the wiring 322 to which the potential RIN is applied and does not include the transistor 305.

Figure 7:
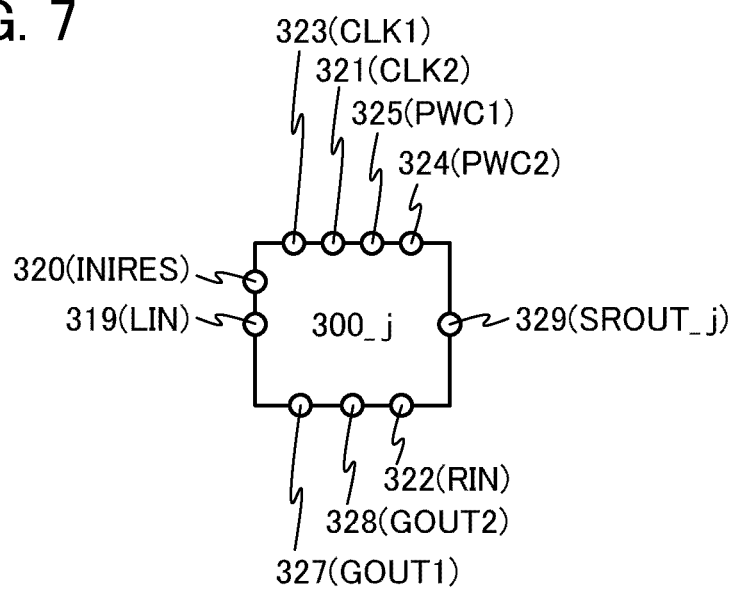
FIG. 7 is a diagram schematically illustrating a j-th pulse generator.

In the shift register illustrated in FIG. 5, positions of the wirings 319 to 325 and the wirings 327 to 329 connected to the pulse generator 300_j (j is a natural number less than or equal to y) are shown schematically in FIG. 7. As can be seen from FIG. 5 and FIG. 7, a potential SROUTj−1 output from the wiring 329 of the previous pulse generator 300_j−1 is applied to the wiring 319 of the pulse generator 300_j as the potential LIN. The potential of a start pulse signal GSP is applied to the wiring 319 of the first pulse generator 300_1.

A potential SROUTj+1 output from the wiring 329 of the subsequent pulse generator 300_j+1 is applied to the wiring 322 of the pulse generator 300_j as the potential RIN. A potential SROUTd output from the wiring 329 of the pulse generator 300_d is applied to the wiring 322 of the pulse generator 300_y as the potential RIN.

The potentials of two of clock signals GCK1 to GCK4 are applied to the wirings 321 and 323. Specifically, in the pulse generator 300_4m+1, the potential of the clock signal GCK1 is applied to the wiring 323 as the potential CLK1, and the potential of the clock signal GCK2 is applied to the wiring 321 as the potential CLK2. In the pulse generator 300_4m+2, the potential of the clock signal GCK2 is applied to the wiring 323 as the potential CLK1, and the potential of the clock signal GCK3 is applied to the wiring 321 as the potential CLK2. In the pulse generator 300_4m+3, the potential of the clock signal GCK3 is applied to the wiring 323 as the potential CLK1, and the potential of the clock signal GCK4 is applied to the wiring 321 as the potential CLK2. In the pulse generator 300_4m+4, the potential of the clock signal GCK4 is applied to the wiring 323 as the potential CLK1, and the potential of the clock signal GCK1 is applied to the wiring 321 as the potential CLK2. In the pulse generator 300_d, the potential of the clock signal GCK1 is applied to the wiring 323 as the potential CLK1, and the potential of the clock signal GCK2 is applied to the wiring 321 as the potential CLK2. Note that m is an integer number given under the condition that the total number of pulse generators 300 is y.

The potential of one of pulse-width control signals PWCA to PWCD and the potential of one of pulse-width control signals PWCa to PWCd are applied to the wiring 324 and the wiring 325, respectively. Specifically, in the pulse generator 300_4m+1, the potential of the pulse-width control signal PWCa is applied to the wiring 325 as the potential PWC1, and the potential of the pulse-width control signal PWCA is applied to the wiring 324 as the potential PWC2. In the pulse generator 300_4m+2, the potential of the pulse-width control signal PWCb is applied to the wiring 325 as the potential PWC1, and the potential of the pulse-width control signal PWCB is applied to the wiring 324 as the potential PWC2. In the pulse generator 300_4m+3, the potential of the pulse-width control signal PWCc is applied to the wiring 325 as the potential PWC1, and the potential of the pulse-width control signal PWCC is applied to the wiring 324 as the potential PWC2. In the pulse generator 300_4m+4, the potential of the pulse-width control signal PWCd is applied to the wiring 325 as the potential PWC1, and the potential of the pulse-width control signal PWCD is applied to the wiring 324 as the potential PWC2. In the pulse generator 300_d, the potential of the pulse-width control signal PWCa is applied to the wiring 325 as the potential PWC1, and the potential of the pulse-width control signal PWCA is applied to the wiring 324 as the potential PWC2.

The potential GOUT1 of the wiring 327 connected to the pulse generator 300_j is applied to a scan line GLaj.

The potential SROUT_j of the wiring 329 connected to the pulse generator 300_j is applied to a scan line GLbj with its polarity inverted by an inverter 351_j. Specifically, in the inverter 351_4m+1, the clock signal GCK2 is input thereto, and when the potential of the clock signal GCK2 is in its low level, the polarity of the potential SROUT_4m+1 is inverted and then the potential is applied to the scan line GLb4m+1. In the inverter 351_4m+2, the clock signal GCK3 is input thereto, and when the potential of the clock signal GCK3 is in its low level, the polarity of the potential SROUT_4m+2 is inverted and then the potential is applied to the scan line GLb4m+2. In the inverter 351_4m+3, the clock signal GCK4 is input thereto, and when the potential of the clock signal GCK4 is in its low level, the polarity of the potential SROUT_4m+3 is inverted and then the potential is applied to the scan line GLb4m+3. In the inverter 351_4m+4, the clock signal GCK1 is input thereto, and when the potential of the clock signal GCK1 is in its low level, the polarity of the potential SROUT_4m+4 is inverted and then the potential is applied to the scan line GLb4m+4. In an inverter 351_d, the clock signal GCK2 is input thereto, and when the potential of the clock signal GCK2 is in its low level, the polarity of the potential SROUT_d is inverted and then the potential is applied to a scan line GLbd.

The potential GOUT2 of the wiring 328 connected to the pulse generator 300_j is applied to a scan line GLcj with its polarity inverted by an inverter 350_j. Specifically, in the inverter 350_4m+1, the clock signal GCK2 is input thereto, and when the potential of the clock signal GCK2 is in its low level, the polarity of the potential GOUT2 is inverted and then the potential is applied to the scan line GLc4m+1. In the inverter 350_4m+2, the clock signal GCK3 is input thereto, and when the potential of the clock signal GCK3 is in its low level, the polarity of the potential GOUT2 is inverted and then the potential is applied to the scan line GLc4m+2. In the inverter 350_4m+3, the clock signal GCK4 is input thereto, and when the potential of the clock signal GCK4 is in its low level, the polarity of the potential GOUT2 is inverted and then the potential is applied to the scan line GLc4m+3. In the inverter 350_4m+4, the clock signal GCK1 is input thereto, and when the potential of the clock signal GCK1 is in its low level, the polarity of the potential GOUT2 is inverted and then the potential is applied to the scan line GLc4m+4. In an inverter 350_d, the clock signal GCK2 is input thereto, and when the potential of the clock signal GCK2 is in its low level, the polarity of the potential GOUT2 is inverted and then the potential is applied to a scan line GLcd.

Next, an operation of the pulse generator 300 illustrated in FIG. 4 is described with reference to a timing chart shown in FIG. 6. In this embodiment, the potential INRES is in its low level throughout all periods.

Figure 6:
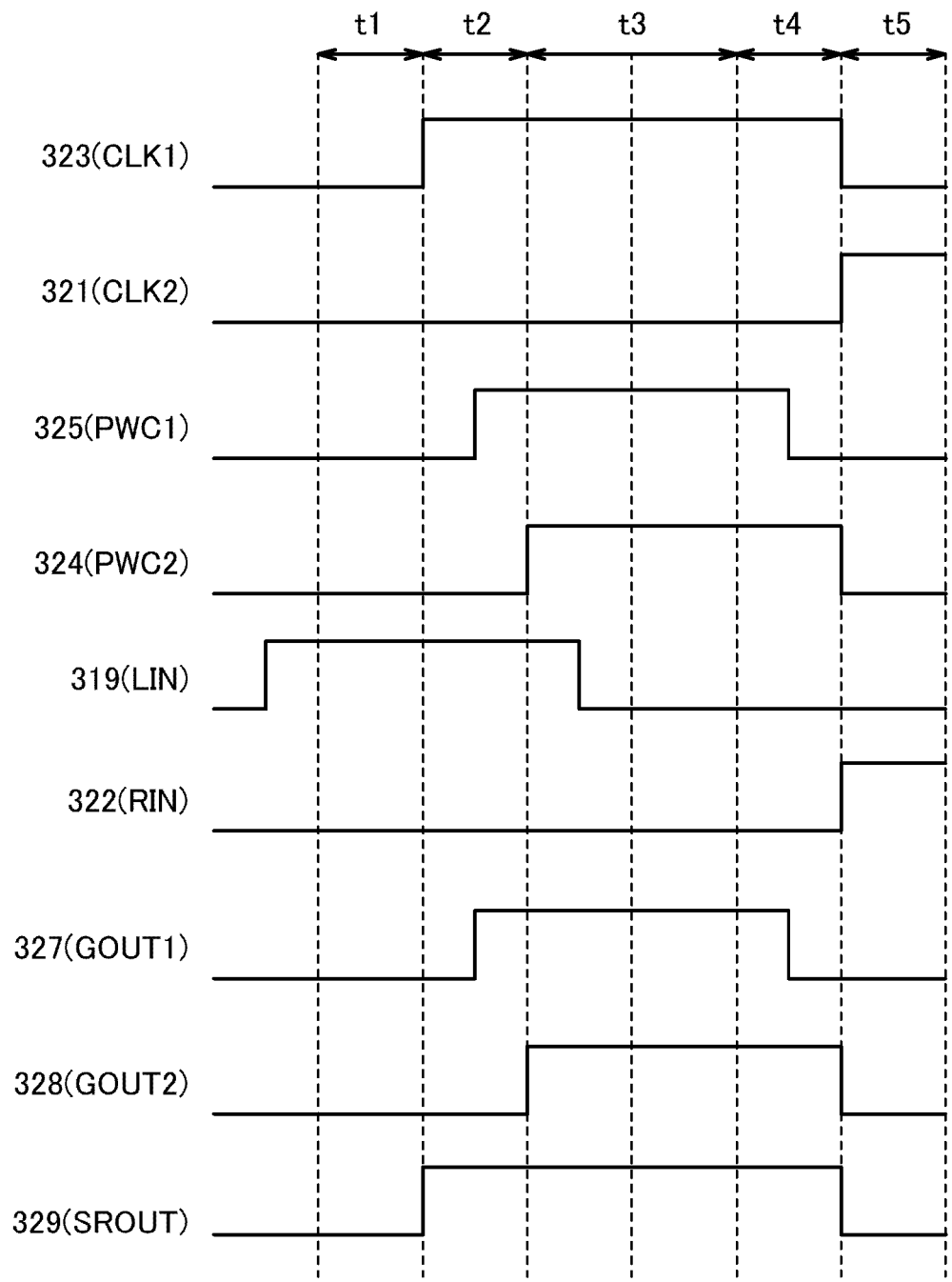
FIG. 6 is a timing chart illustrating an operation of a pulse output circuit.

As shown in FIG. 6, in a period t1, the potential CLK1 applied to the wiring 323 is in its low level, the potential CLK2 applied to the wiring 321 is in its low level, the potential of the pulse-width control signal PWC1 applied to the wiring 325 is in its low level, the potential of the pulse-width control signal PWC2 applied to the wiring 324 is in its low level, the potential LIN applied to the wiring 319 is in its high level, and the potential RIN applied to the wiring 322 is in its low level.

Therefore, in the period t1, in the pulse generator 300, the potential (low level) of the pulse-width control signal PWC1 applied to the wiring 325 is applied to the wiring 327 as the potential GOUT1. The potential (low level) of the pulse-width control signal PWC2 applied to the wiring 324 is applied to the wiring 328 as the potential GOUT2. The potential CLK1 (low level) applied to the wiring 323 is applied to the wiring 329 as the potential SROUT.

Next, as shown in FIG. 6, in a period t2, the potential CLK1 applied to the wiring 323 is in its high level, the potential CLK2 applied to the wiring 321 is in its low level, the level of the potential of the pulse-width control signal PWC1 applied to the wiring 325 is changed from low level to high level, the potential of the pulse-width control signal PWC2 applied to the wiring 324 is in its low level, the potential LIN applied to the wiring 319 is in its high level, and the potential RIN applied to the wiring 322 is in its low level.

Therefore, in the period t2, in the pulse generator 300, the potential (changing from low level to high level) of the pulse-width control signal PWC1 applied to the wiring 325 is applied to the wiring 327 as the potential GOUT1. The potential (low level) of the pulse-width control signal PWC2 applied to the wiring 324 is applied to the wiring 328 as the potential GOUT2. The potential CLK1 (high level) applied to the wiring 323 is applied to the wiring 329 as the potential SROUT.

Next, as shown in FIG. 6, in a period t3, the potential CLK1 applied to the wiring 323 is in its high level, the potential CLK2 applied to the wiring 321 is in its low level, the potential of the pulse-width control signal PWC1 applied to the wiring 325 is in its high level, the potential of the pulse-width control signal PWC2 applied to the wiring 324 is in its high level, the level of the potential LIN applied to the wiring 319 is changed from high level to low level, and the potential RIN applied to the wiring 322 is in its low level.

Therefore, in the period t3, in the pulse generator 300, the potential (high level) of the pulse-width control signal PWC1 applied to the wiring 325 is applied to the wiring 327 as the potential GOUT1. The potential (high level) of the pulse-width control signal PWC2 applied to the wiring 324 is applied to the wiring 328 as the potential GOUT2. The potential CLK1 (high level) applied to the wiring 323 is applied to the wiring 329 as the potential SROUT.

Next, as shown in FIG. 6, in a period t4, the potential CLK1 applied to the wiring 323 is in its high level, the potential CLK2 applied to the wiring 321 is in its low level, the level of the potential of the pulse-width control signal PWC1 applied to the wiring 325 is changed from high level to low level, the potential of the pulse-width control signal PWC2 applied to the wiring 324 is in its high level, the potential LIN applied to the wiring 319 is in its low level, and the potential RIN applied to the wiring 322 is in its low level.

Therefore, in the period t4, in the pulse generator 300, the potential (changing from high level to low level) of the pulse-width control signal PWC1 applied to the wiring 325 is applied to the wiring 327 as the potential GOUT1. The potential (high level) of the pulse-width control signal PWC2 applied to the wiring 324 is applied to the wiring 328 as the potential GOUT2. The potential CLK1 (high level) applied to the wiring 323 is applied to the wiring 329 as the potential SROUT.

Next, as shown in FIG. 6, in a period t5, the potential CLK1 applied to the wiring 323 is in its low level, the potential CLK2 applied to the wiring 321 is in its high level, the potential of the pulse-width control signal PWC1 applied to the wiring 325 is in its low level, the potential of the pulse-width control signal PWC2 applied to the wiring 324 is in its low level, the potential LIN applied to the wiring 319 is in its low level, and the potential RIN applied to the wiring 322 is in its high level.

Therefore, in the period t5, in the pulse generator 300, the potential VEE (low level) applied to the wiring 326 is applied to the wiring 327 as the potential GOUT1. The potential VSS (low level) applied to the wiring 318 is applied to the wiring 328 as the potential GOUT2. The potential VSS (low level) applied to the wiring 318 is applied to the wiring 329 as the potential SROUT.

In one embodiment of the present invention, as described in Embodiment 1, at least one of their respective gate electrodes of the transistors 309, 312, and 315 which correspond to transistors on the output side is electrically connected to the gate electrode of the transistor 302 by a conductive film which is different from these gate electrodes. This structure enables the area of each conductive film which functions as the gate electrode to be smaller than that in the case where all of their respective gate electrodes of the transistors 309, 312, 315, and 302 are formed of one conductive film. Accordingly, electrostatic destruction attributed to an antenna effect of the conductive film which functions as a gate electrode can be less likely to occur. Accordingly, reduction in the yield attributed to electrostatic destruction is less likely to occur in a semiconductor device using the above-described shift register according to one embodiment of the present invention.

This embodiment can be implemented combining with another embodiment as appropriate.

Embodiment 3

Configuration examples of a pulse generator for a semiconductor device according to one embodiment of the present invention are described.

Figure 8A:
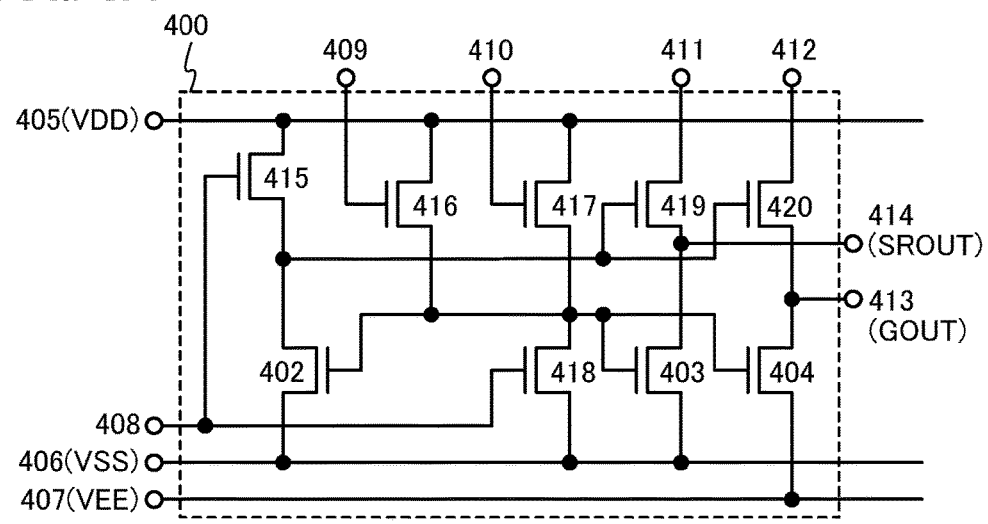
FIGS. 8A and 8B are diagrams each illustrating a configuration of a pulse generator.

A pulse generator 400 illustrated in FIG. 8A includes transistors 402 to 404 and transistors 415 to 420. A shift register can be constituted by connecting the plurality of pulse generators 400 in series.

A gate electrode of the transistor 402 is connected to respective gate electrodes of the transistors 403 and 404; one of a source and drain terminals of the transistor 402 is connected to a wiring 406; and the other of the source and drain terminals of the transistor 402 is connected to a gate electrode of the transistor 420. One of a source and drain terminals of the transistor 403 is connected to the wiring 406; and the other of the source and drain terminals of the transistor 403 is connected to a wiring 414. One of a source and drain terminals of the transistor 404 is connected to a wiring 407; and the other of the source and drain terminals of the transistor 404 is connected to a wiring 413.

A gate electrode of the transistor 415 is connected to a wiring 408; one of a source and drain terminals of the transistor 415 is connected to the gate electrode of the transistor 420; and the other of the source and drain terminals of the transistor 415 is connected to a wiring 405. A gate electrode of the transistor 416 is connected to a wiring 409; one of a source and drain terminals of the transistor 416 is connected to their respective gate electrodes of the transistors 402, 403, and 404; and the other of the source and drain terminals of the transistor 416 is connected to the wiring 405. A gate electrode of the transistor 417 is connected to a wiring 410; one of a source and drain terminals of the transistor 417 is connected to their respective gate electrodes of the transistors 402, 403, and 404; and the other of the source and drain terminals of the transistor 417 is connected to the wiring 405. A gate electrode of the transistor 418 is connected to the wiring 408; one of a source and drain terminals of the transistor 418 is connected to the wiring 406; and the other of the source and drain terminals of the transistor 418 is connected to their respective gate electrodes of the transistors 402, 403, and 404. A gate electrode of the transistor 419 is connected to the gate electrode of the transistor 420; one of a source and drain terminals of the transistor 419 is connected to the wiring 414; and the other of the source and drain terminals of the transistor 419 is connected to a wiring 411. One of a source and drain terminals of the transistor 420 is connected to the wiring 413; and the other of the source and drain terminals of the transistor 420 is connected to a wiring 412.

In the case where the transistors 402 to 404 and the transistors 415 to 420 are n-channel transistors, specifically, the potential VDD is applied to the wiring 405, the potential VSS is applied to the wiring 406, and the potential VEE is applied to the wiring 407. Respective potentials of appropriate signals such as clock signals are applied to the wirings 408 to 412. The potential GOUT and the potential SROUT are output from the wiring 413 and the wiring 414, respectively.

In one embodiment of the present invention, at least one of their respective gate electrodes of the transistors 403 and 404 which correspond to transistors on the output side is electrically connected to the gate electrode of the transistor 402 by a conductive film which is provided in a layer different from these gate electrodes. This structure enables the area of each conductive film which functions as the gate electrode to be smaller than that in the case where all of their respective gate electrodes of the transistors 403, 404, and 402 are formed of one conductive film. Accordingly, electrostatic destruction attributed to an antenna effect of the conductive film which functions as a gate electrode can be less likely to occur. Accordingly, reduction in the yield attributed to electrostatic destruction can be less likely to occur in a semiconductor device using the above-described pulse generator 400 for a shift register or the like according to one embodiment of the present invention.

In one embodiment of the present invention, the gate electrode of the transistor 420 which corresponds to a transistor on the output side may be electrically connected to the gate electrode of the transistor 419 which corresponds to a transistor on the output side by a conductive film which is provided in a layer different from these gate electrodes. This structure enables reduction in the yield attributed to electrostatic destruction to be less likely to occur in a semiconductor device using the above-described pulse generator 400 for a shift register or the like according to one embodiment of the present invention.

Although the one of the source and drain terminals of the transistor 404 on the output side is connected to the wiring 407 in FIG. 8A, embodiments of the present invention are not limited thereto. The one of the source and drain terminals of the transistor 404 on the output side may be connected to the wiring 406. However, the connection of the one of the source and drain terminals of the transistor 404 on the output side not to the wiring 406 but to the wiring 407 as shown in FIG. 8A enables the transistor 404 to be surely turned off even in the case where the transistor 404 is a normally-on transistor.

Figure 8B:
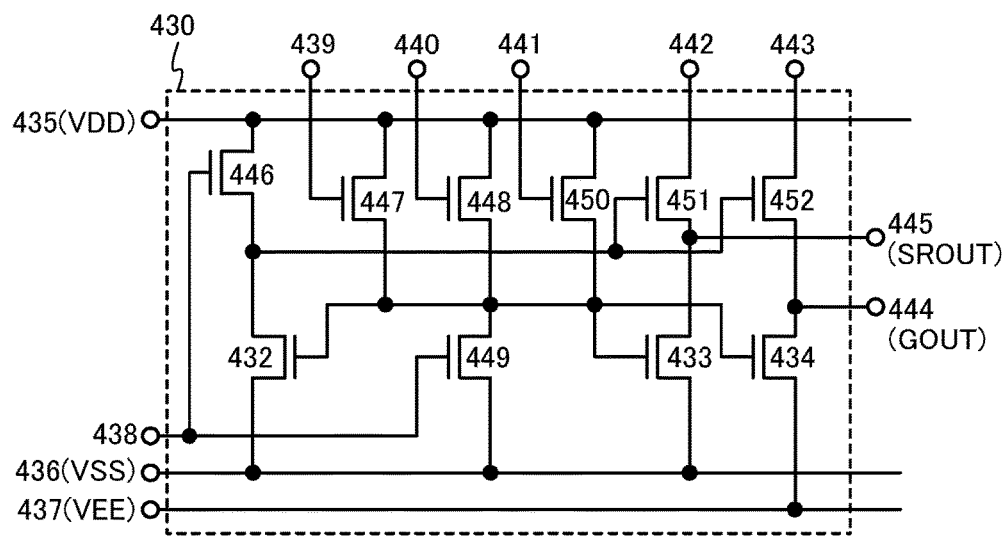

A pulse generator 430 illustrated in FIG. 8B includes transistors 432 to 434 and transistors 446 to 452. A shift register can be constituted by connecting the plurality of pulse generators 430 in series.

A gate electrode of the transistor 432 is connected to respective gate electrodes of the transistors 433 and 434; one of a source and drain terminals of the transistor 432 is connected to a wiring 436; and the other of the source and drain terminals of the transistor 432 is connected to respective gate electrodes of the transistors 451 and 452. One of a source and drain terminals of the transistor 433 is connected to the wiring 436; and the other of the source and drain terminals of the transistor 433 is connected to a wiring 445. One of a source and drain terminals of the transistor 434 is connected to a wiring 437; and the other of the source and drain terminals of the transistor 434 is connected to a wiring 444.

A gate electrode of the transistor 446 is connected to a wiring 438; one of a source and drain terminals of the transistor 446 is connected to their respective gate electrodes of the transistors 451 and 452; and the other of the source and drain terminals of the transistor 446 is connected to a wiring 435. A gate electrode of the transistor 447 is connected to a wiring 439; one of a source and drain terminals of the transistor 447 is connected to their respective gate electrodes of the transistors 432, 433, and 434; and the other of the source and drain terminals of the transistor 447 is connected to the wiring 435. A gate electrode of the transistor 448 is connected to a wiring 440; one of a source and drain terminals of the transistor 448 is connected to their respective gate electrodes of the transistors 432, 433, and 434; and the other of the source and drain terminals of the transistor 448 is connected to the wiring 435. A gate electrode of the transistor 449 is connected to the wiring 438; one of a source and drain terminals of the transistor 449 is connected to the wiring 436; and the other of the source and drain terminals of the transistor 449 is connected to their respective gate electrodes of the transistors 432, 433, and 434. A gate electrode of the transistor 450 is connected to a wiring 441; one of a source and drain terminals of the transistor 450 is connected to their respective gate electrodes of the transistors 432, 433, and 434; and the other of the source and drain terminals of the transistor 450 is connected to the wiring 435. One of a source and drain terminals of the transistor 451 is connected to the wiring 445; and the other of the source and drain terminals of the transistor 451 is connected to a wiring 442. One of a source and drain terminals of the transistor 452 is connected to the wiring 444; and the other of the source and drain terminals of the transistor 452 is connected to a wiring 443.

In the case where the transistors 432 to 434 and the transistors 446 to 452 are n-channel transistors, specifically, the potential VDD is applied to the wiring 435, the potential VSS is applied to the wiring 436, and the potential VEE is applied to the wiring 437. Respective potentials of appropriate signals such as clock signals are applied to the wirings 438 to 443. The potential GOUT and the potential SROUT are output from the wiring 444 and the wiring 445, respectively.

In one embodiment of the present invention, at least one of their respective gate electrodes of the transistors 433 and 434 which correspond to transistors on the output side is electrically connected to the gate electrode of the transistor 432 by a conductive film which is provided in a layer different from these gate electrodes. This structure enables the area of each conductive film which functions as the gate electrode to be smaller than that in the case where all of their respective gate electrodes of the transistors 433, 434, and 432 are formed of one conductive film. Accordingly, electrostatic destruction attributed to an antenna effect of the conductive film which functions as a gate electrode can be less likely to occur. Accordingly, reduction in the yield attributed to electrostatic destruction can be less likely to occur in a semiconductor device using the above-described pulse generator 430 for a shift register or the like according to one embodiment of the present invention.

In one embodiment of the present invention, the gate electrode of the transistor 452 which corresponds to a transistor on the output side may be electrically connected to the gate electrode of the transistor 451 which corresponds to a transistor on the output side by a conductive film which is provided in a layer different from these gate electrodes. This structure enables reduction in the yield attributed to electrostatic destruction to be less likely to occur in a semiconductor device using the above-described pulse generator 430 for a shift register or the like according to one embodiment of the present invention.

Although the one of the source and drain terminals of the transistor 434 on the output side is connected to the wiring 437 in FIG. 8B, embodiments of the present invention are not limited thereto. The one of the source and drain terminals of the transistor 434 on the output side may be connected to the wiring 436. However, the connection of the one of the source and drain terminals of the transistor 434 on the output side not to the wiring 436 but to the wiring 437 as shown in FIG. 8B enables the transistor 434 to be surely turned off even in the case where the transistor 434 is a normally-on transistor.

Figure 9A:
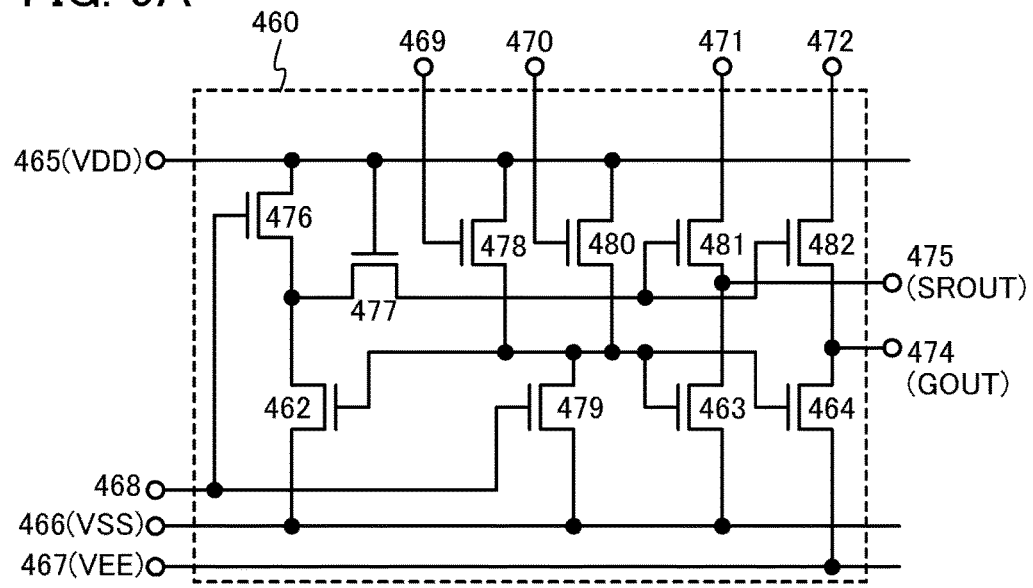
FIGS. 9A and 9B are diagrams each illustrating a configuration of a pulse generator.

A pulse generator 460 illustrated in FIG. 9A includes transistors 462 to 464 and transistors 476 to 482. A shift register can be constituted by connecting the plurality of pulse generators 460 in series.

A gate electrode of the transistor 462 is connected to respective gate electrodes of the transistors 463 and 464; one of a source and drain terminals of the transistor 462 is connected to a wiring 466; and the other of the source and drain terminals of the transistor 462 is connected to one of a source and drain terminals of the transistor 477. One of a source and drain terminals of the transistor 463 is connected to the wiring 466; and the other of the source and drain terminals of the transistor 463 is connected to a wiring 475. One of a source and drain terminals of the transistor 464 is connected to a wiring 467; and the other of the source and drain terminals of the transistor 464 is connected to a wiring 474.

A gate electrode of the transistor 476 is connected to a wiring 468; one of a source and drain terminals of the transistor 476 is connected to the one of the source and drain terminals of the transistor 477; and the other of the source and drain terminals of the transistor 476 is connected to a wiring 465. A gate electrode of the transistor 477 is connected to the wiring 465; and the other of the source and drain terminals of the transistor 477 is connected to respective gate electrodes of the transistors 481 and 482. A gate electrode of the transistor 478 is connected to a wiring 469; one of a source and drain terminals of the transistor 478 is connected to their respective gate electrodes of the transistors 462, 463, and 464; and the other of the source and drain terminals of the transistor 478 is connected to the wiring 465. A gate electrode of the transistor 479 is connected to the wiring 468; one of a source and drain terminals of the transistor 479 is connected to the wiring 466; and the other of the source and drain terminals of the transistor 479 is connected to their respective gate electrodes of the transistors 462, 463, and 464. A gate electrode of the transistor 480 is connected to a wiring 470; one of a source and drain terminals of the transistor 480 is connected to their respective gate electrodes of the transistors 462, 463, and 464; and the other of the source and drain terminals of the transistor 480 is connected to the wiring 465. One of a source and drain terminals of the transistor 481 is connected to the wiring 475; and the other of the source and drain terminals of the transistor 481 is connected to a wiring 471. One of a source and drain terminals of the transistor 482 is connected to the wiring 474; and the other of the source and drain terminals of the transistor 482 is connected to a wiring 472.

In the case where the transistors 462 to 464 and the transistors 476 to 482 are n-channel transistors, specifically, the potential VDD is applied to the wiring 465, the potential VSS is applied to the wiring 466, and the potential VEE is applied to the wiring 467. Respective potentials of appropriate signals such as clock signals are applied to the wirings 468 to 472. The potential GOUT and the potential SROUT are output from the wiring 474 and the wiring 475, respectively.

In one embodiment of the present invention, at least one of their respective gate electrodes of the transistors 463 and 464 which correspond to transistors on the output side is electrically connected to the gate electrode of the transistor 462 by a conductive film which is provided in a layer different from these gate electrodes. This structure enables the area of each conductive film which functions as the gate electrode to be smaller than that in the case where all of their respective gate electrodes of the transistors 463, 464, and 462 are formed of one conductive film. Accordingly, electrostatic destruction attributed to an antenna effect of the conductive film which functions as a gate electrode can be less likely to occur. Accordingly, reduction in the yield attributed to electrostatic destruction can be less likely to occur in a semiconductor device using the above-described pulse generator 460 for a shift register or the like according to one embodiment of the present invention.

In one embodiment of the present invention, the gate electrode of the transistor 482 which corresponds to a transistor on the output side may be electrically connected to the gate electrode of the transistor 481 which corresponds to a transistor on the output side by a conductive film which is provided in a layer different from these gate electrodes. This structure enables reduction in the yield attributed to electrostatic destruction to be less likely to occur in a semiconductor device using the above-described pulse generator 460 for a shift register or the like according to one embodiment of the present invention.

Although the one of the source and drain terminals of the transistor 464 on the output side is connected to the wiring 467 in FIG. 9A, embodiments of the present invention are not limited thereto. The one of the source and drain terminals of the transistor 464 on the output side may be connected to the wiring 466. However, the connection of the one of the source and drain terminals of the transistor 464 on the output side not to the wiring 466 but to the wiring 467 as shown in FIG. 9A enables the transistor 464 to be surely turned off even in the case where the transistor 464 is a normally-on transistor.

Figure 9B:
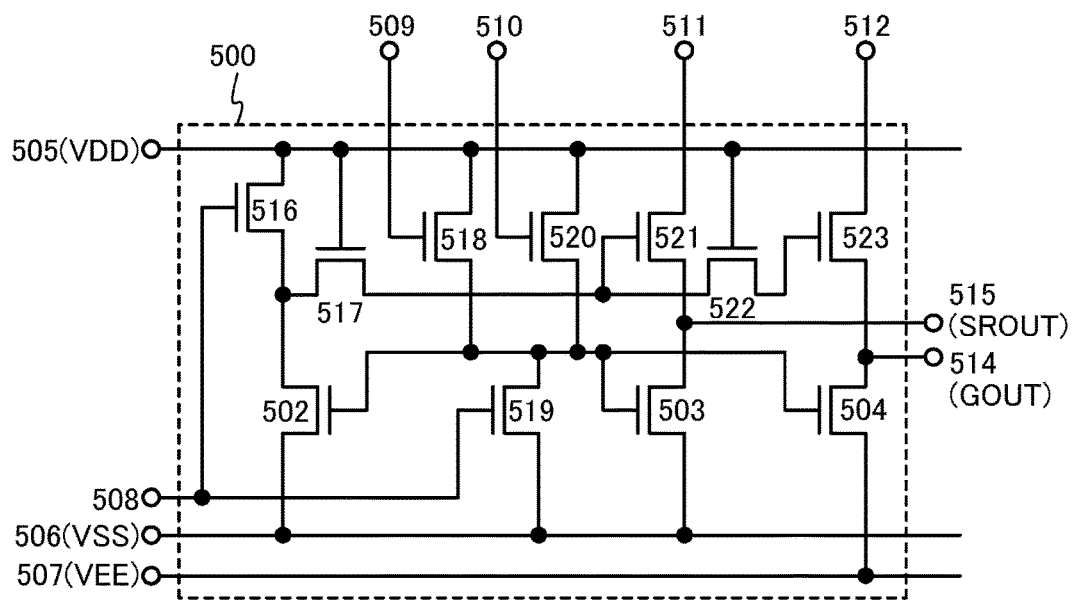

A pulse generator 500 illustrated in FIG. 9B includes transistors 502 to 504 and transistors 516 to 523. A shift register can be constituted by connecting the plurality of pulse generators 500 in series.

A gate electrode of the transistor 502 is connected to respective gate electrodes of the transistors 503 and 504; one of a source and drain terminals of the transistor 502 is connected to a wiring 506; and the other of the source and drain terminals of the transistor 502 is connected to one of a source and drain terminals of the transistor 517. One of a source and drain terminals of the transistor 503 is connected to the wiring 506; and the other of the source and drain terminals of the transistor 503 is connected to a wiring 515. One of a source and drain terminals of the transistor 504 is connected to a wiring 507; and the other of the source and drain terminals of the transistor 504 is connected to a wiring 514.

A gate electrode of the transistor 516 is connected to a wiring 508; one of a source and drain terminals of the transistor 516 is connected to the one of the source and drain terminals of the transistor 517; and the other of the source and drain terminals of the transistor 516 is connected to a wiring 505. A gate electrode of the transistor 517 is connected to the wiring 505; the other of the source and drain terminals of the transistor 517 is connected to a gate electrode of the transistor 521. A gate electrode of the transistor 518 is connected to a wiring 509; one of a source and drain terminals of the transistor 518 is connected to their respective gate electrodes of the transistors 502, 503, and 504; and the other of the source and drain terminals of the transistor 518 is connected to the wiring 505. A gate electrode of the transistor 519 is connected to a wiring 508; one of a source and drain terminals of the transistor 519 is connected to the wiring 506; and the other of the source and drain terminals of the transistor 519 is connected to their respective gate electrodes of the transistors 502, 503, and 504. A gate electrode of the transistor 520 is connected to a wiring 510; one of a source and drain terminals of the transistor 520 is connected to their respective gate electrodes of the transistors 502, 503, and 504; and the other of the source and drain terminals of the transistor 520 is connected to the wiring 505. One of a source and drain terminals of the transistor 521 is connected to the wiring 515; and the other of the source and drain terminals of the transistor 521 is connected to a wiring 511. A gate electrode of the transistor 522 is connected to the wiring 505; one of a source and drain terminals of the transistor 522 is connected to the gate electrode of the transistor 521; and the other of the source and drain terminals of the transistor 522 is connected to a gate electrode of the transistor 523. One of a source and drain terminals of the transistor 523 is connected to the wiring 514; and the other of the source and drain terminals of the transistor 523 is connected to a wiring 512.

In the case where the transistors 502 to 504 and the transistors 516 to 523 are n-channel transistors, specifically, the potential VDD is applied to the wiring 505, the potential VSS is applied to the wiring 506, and the potential VEE is applied to the wiring 507. Respective potentials of appropriate signals such as clock signals are applied to the wirings 508 to 512. The potential GOUT and the potential SROUT are output from the wiring 514 and the wiring 515, respectively.

In one embodiment of the present invention, at least one of their respective gate electrodes of the transistors 503 and 504 which correspond to transistors on the output side is electrically connected to the gate electrode of the transistor 502 by a conductive film which is provided in a layer different from these gate electrodes. This structure enables the area of each conductive film which functions as the gate electrode to be smaller than that in the case where all of their respective gate electrodes of the transistors 503, 504, and 502 are formed of one conductive film. Accordingly, electrostatic destruction attributed to an antenna effect of the conductive film which functions as a gate electrode can be less likely to occur. Accordingly, reduction in the yield attributed to electrostatic destruction can be less likely to occur in a semiconductor device using the above-described pulse generator 500 for a shift register or the like according to one embodiment of the present invention.

Although the one of the source and drain terminals of the transistor 504 on the output side is connected to the wiring 507 in FIG. 9B, embodiments of the present invention are not limited thereto. The one of the source and drain terminals of the transistor 504 on the output side may be connected to the wiring 506. However, the connection of the one of the source and drain terminals of the transistor 504 on the output side not to the wiring 506 but to the wiring 507 as shown in FIG. 9B enables the transistor 504 to be surely turned off even in the case where the transistor 504 is a normally-on transistor.

Figure 10:
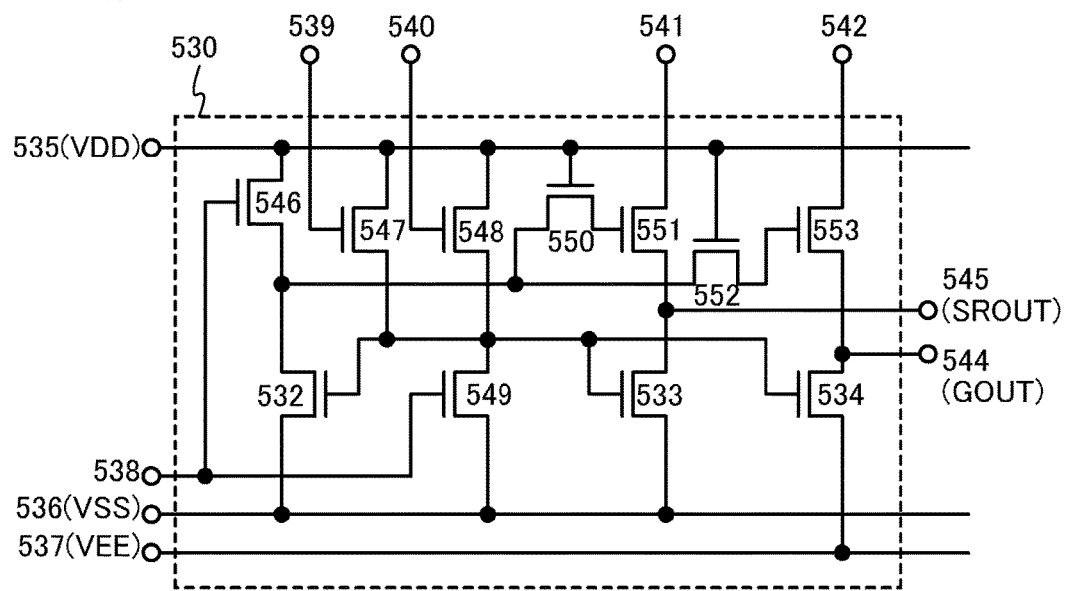
FIG. 10 is a diagram illustrating a configuration of a pulse generator.

A pulse generator 530 illustrated in FIG. 10 includes transistors 532 to 534 and transistors 546 to 553. A shift register can be constituted by connecting the plurality of pulse generators 530 in series.

A gate electrode of the transistor 532 is connected to respective gate electrodes of the transistors 533 and 534; one of a source and drain terminals of the transistor 532 is connected to a wiring 536; and the other of the source and drain terminals of the transistor 532 is connected to one of a source and drain terminals of the transistor 552. One of a source and drain terminals of the transistor 533 is connected to the wiring 536; and the other of the source and drain terminals of the transistor 533 is connected to a wiring 545. One of a source and drain terminals of the transistor 534 is connected to a wiring 537; and the other of the source and drain terminals of the transistor 534 is connected to a wiring 544.

A gate electrode of the transistor 546 is connected to a wiring 538; one of a source and drain terminals of the transistor 546 is connected to the one of the source and drain terminals of the transistor 532; and the other of the source and drain terminals of the transistor 546 is connected to a wiring 535. A gate electrode of the transistor 547 is connected to a wiring 539; one of a source and drain terminals of the transistor 547 is connected to respective gate electrodes of the transistors 532, 533, and 534; and the other of the source and drain terminals of the transistor 547 is connected to the wiring 535. A gate electrode of the transistor 548 is connected to a wiring 540; one of a source and drain terminals of the transistor 548 is connected to their respective gate electrodes of the transistors 532, 533, and 534; and the other of the source and drain terminals of the transistor 548 is connected to the wiring 535. A gate electrode of the transistor 549 is connected to the wiring 538; one of a source and drain terminals of the transistor 549 is connected to the wiring 536; and the other of the source and drain terminals of the transistor 549 is connected to their respective gate electrodes of the transistors 532, 533, and 534. A gate electrode of the transistor 550 is connected to the wiring 535; one of a source and drain terminals of the transistor 550 is connected to one of a source and drain terminals of the transistor 552; and the other of the source and drain terminals of the transistor 550 is connected to a gate electrode of the transistor 551. One of a source and drain terminals of the transistor 551 is connected to the wiring 545; and the other of the source and drain terminals of the transistor 551 is connected to a wiring 541. A gate electrode of the transistor 552 is connected to the wiring 535; and the other of the source and drain terminals of the transistor 552 is connected to a gate electrode of the transistor 553. One of a source and drain terminals of the transistor 553 is connected to the wiring 544; and the other of the source and drain terminals of the transistor 553 is connected to a wiring 542.

In the case where the transistors 532 to 534 and the transistors 546 to 553 are n-channel transistors, specifically, the potential VDD is applied to the wiring 535, the potential VSS is applied to the wiring 536, and the potential VEE is applied to the wiring 537. Respective potentials of appropriate signals such as clock signals are applied to the wirings 538 to 542. The potential GOUT and the potential SROUT are output from the wiring 544 and the wiring 545, respectively.

In one embodiment of the present invention, at least one of their respective gate electrodes of the transistors 533 and 534 which correspond to transistors on the output side is electrically connected to the gate electrode of the transistor 532 by a conductive film which is provided in a layer different from these gate electrodes. This structure enables the area of each conductive film which functions as the gate electrode to be smaller than that in the case where all of their respective gate electrodes of the transistors 533, 534, and 532 are formed of one conductive film. Accordingly, electrostatic destruction attributed to an antenna effect of the conductive film which functions as a gate electrode can be less likely to occur. Accordingly, reduction in the yield attributed to electrostatic destruction can be less likely to occur in a semiconductor device using the above-described pulse generator 530 for a shift register or the like according to one embodiment of the present invention.

Although the one of the source and drain terminals of the transistor 534 on the output side is connected to the wiring 537 in FIG. 10, embodiments of the present invention are not limited thereto. The one of the source and drain terminals of the transistor 534 on the output side may be connected to the wiring 536. However, the connection of the one of the source and drain terminals of the transistor 534 on the output side not to the wiring 536 but to the wiring 537 as shown in FIG. 10 enables the transistor 534 to be surely turned off even in the case where the transistor 534 is a normally-on transistor.

This embodiment can be implemented combining with another embodiment as appropriate.

Embodiment 4

Cross-sectional structures of a pixel and a driver circuit in a semiconductor display device according to one embodiment of the present invention are described with reference to FIG. 11 by using an OLED light-emitting device as an example. As one example, cross-sectional views of a pixel 840 and a driver circuit 841 are illustrated in FIG. 11.

Figure 11:
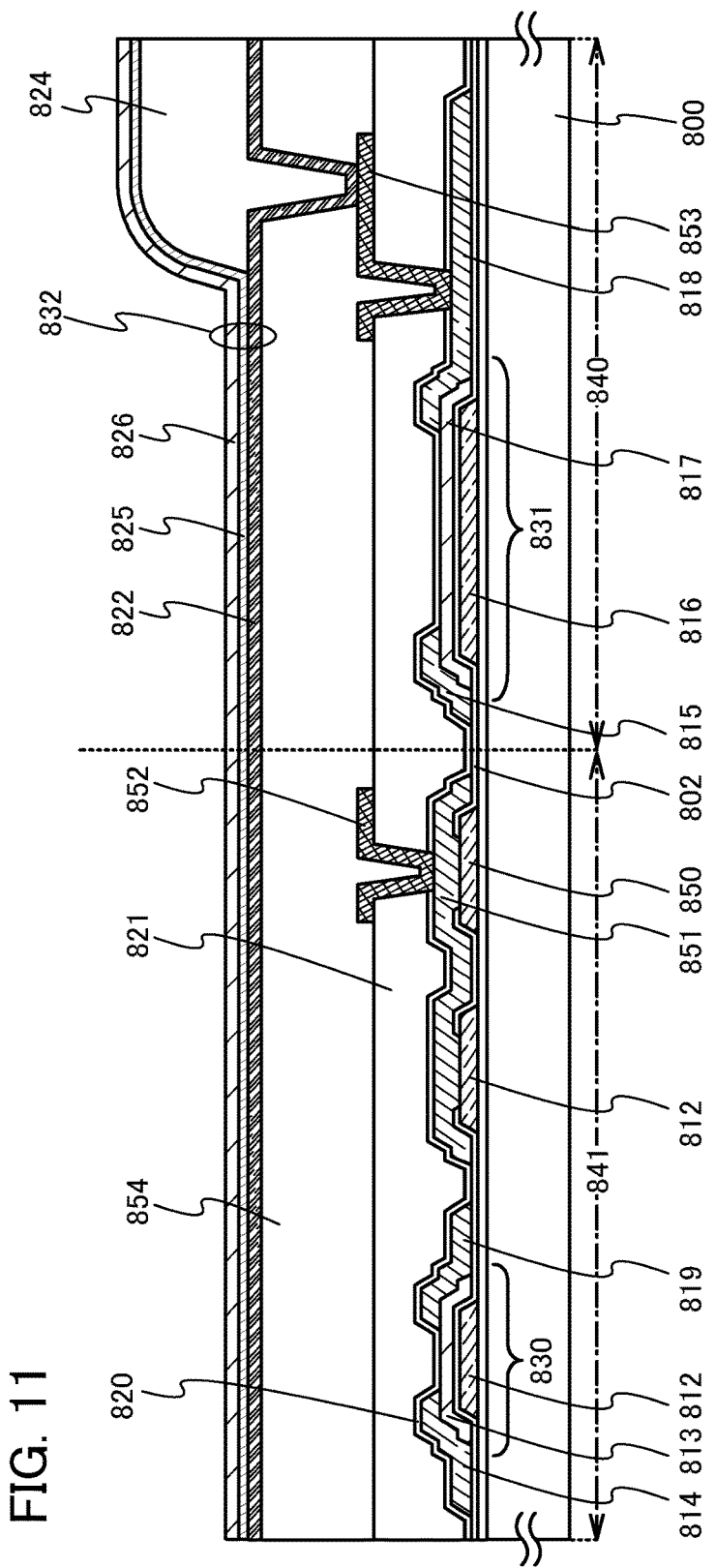
FIG. 11 is cross-sectional views of a driver circuit and a pixel.

In FIG. 11, the pixel 840 includes a light-emitting element 832 and a transistor 831 for controlling supply of current to the light-emitting element 832. The pixel 840 may include a variety of semiconductor elements such as a transistor for controlling input of an image signal to the pixel 840 and a capacitor for holding the potential of an image signal, in addition to the light-emitting element 832 and the transistor 831.

Further, in FIG. 11, the driver circuit 841 includes a transistor 830. Specifically, the transistor 830 corresponds to a transistor on an output side in a shift register which is part of the driver circuit 841. The driver circuit 841 may include a variety of semiconductor elements such as a transistor and a capacitor, in addition to the transistor 830.

The transistor 831 includes, over a substrate 800 having an insulating surface, a conductive film 816 functioning as a gate electrode, a gate insulating film 802 over the conductive film 816, a semiconductor film 817 provided over the gate insulating film 802 to overlap with the conductive film 816, and conductive films 815 and 818 which are provided over the semiconductor film 817 and function as a source terminal and a drain terminal. The conductive film 816 also functions as a scan line.

The transistor 830 includes, over the substrate 800 having an insulating surface, a conductive film 812 functioning as a gate electrode, the gate insulating film 802 over the conductive film 812, a semiconductor film 813 provided over the gate insulating film 802 to overlap with the conductive film 812, and conductive films 814 and 819 which are provided over the semiconductor film 813 and function as a source terminal and a drain terminal.

Further, a conductive film 850 provided over the substrate 800 having an insulating surface functions as a gate electrode of a transistor which is different from the transistor 830. The conductive films 812 and 850 are connected to a conductive film 851 formed over the gate insulating film 802, in respective openings formed in the gate insulating film 802.

In addition, insulating films 820 and 821 are sequentially stacked over the conductive films 814, 815, 818, 819, and 851. Over the insulating film 821, conductive films 852 and 853 are provided. In respective openings formed in the insulating films 820 and 821, the conductive film 852 is connected to the conductive film 851, and the conductive film 853 is connected to the conductive film 818.

Further, an insulating film 854 is provided over the conductive films 852 and 853. A conductive film 822 functioning as an anode is provided over the insulating film 854. The conductive film 822 is connected to the conductive film 853 in an opening formed in the insulating film 854.

An insulating film 824 having an opening to which part of the conductive film 822 is exposed is provided over the insulating film 854. An EL layer 825 and a conductive film 826 functioning as a cathode are sequentially stacked over the part of the conductive film 822 and the insulating film 854. A region where the conductive film 822, the EL layer 825, and the conductive film 826 overlap with each other corresponds to the light-emitting element 832.

In one embodiment of the present invention, the transistor 830, 831 may use a semiconductor film using an amorphous, microcrystalline, polycrystalline, or single crystal semiconductor of silicon, germanium, or the like, or a semiconductor film using a wide bandgap semiconductor such as an oxide semiconductor.

In the case where the semiconductor film of the transistor 830, 831 uses an amorphous, microcrystalline, polycrystalline, or single crystal semiconductor of silicon, germanium, or the like, an impurity element imparting one conductivity type is added to the semiconductor film, whereby impurity regions functioning as a source region and a drain region are formed. For example, an impurity region having n-type conductivity can be formed by adding phosphorus or arsenic to the semiconductor film. Further, for example, an impurity region having p-type conductivity can be formed by adding boron to the semiconductor film.

In the case where the semiconductor film of the transistor 830, 831 uses an oxide semiconductor, a dopant may be added to the semiconductor film, whereby impurity regions functioning as a source region and a drain region may be formed. The dopant can be added by an ion implantation method. Examples of the dopant are a rare gas such as helium, argon, and xenon; and a Group 15 element such as nitrogen, phosphorus, arsenic, and antimony. For example, in the case where nitrogen is used as the dopant, the concentration of nitrogen atoms in the impurity region is preferably greater than or equal to $5\times10^{19}/cm^3$ and less than or equal to $1\times10^{22}/cm^3$.

As a silicon semiconductor, any of the following can be used, for example: amorphous silicon formed by a sputtering method or a vapor phase growth method such as a plasma-enhanced CVD method, polycrystalline silicon crystallized by subjecting amorphous silicon to a process such as laser annealing, and single crystal silicon obtained in such a manner that a surface portion of a single crystal silicon wafer is separated by implantation of hydrogen ions or the like into the wafer.

As for an oxide semiconductor, it is preferable that at least indium (In) or zinc (Zn) be contained. In particular, In and Zn are preferably contained. The oxide semiconductor preferably contains, in addition to In and Zn, gallium (Ga) as a stabilizer that reduces variations in electrical characteristics among transistors using the above-described oxide. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, the following can be used: an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. The oxide semiconductor may include silicon.

For example, the "In—Ga—Zn-based oxide" means an oxide containing In, Ga, and Zn and there is no particular limitation on the ratio of In, Ga, and Zn. In addition, the In—Ga—Zn-based oxide may further contain a metal element other than In, Ga, and Zn. In addition, the In—Ga—Zn-based oxide, whose resistance at no electric field is sufficiently high and thus enables the off-state current to be sufficiently small and whose mobility is high, is suitable for a semiconductor material for a semiconductor device.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, a high mobility can be obtained relatively easily in the case of using an In—Sn—Zn-based oxide. However, the mobility can be increased by reducing the defect density in the bulk also in the case of using an In—Ga—Zn-based oxide.

Further, a highly purified oxide semiconductor obtained by reducing impurities such as moisture and hydrogen which serve as an electron donor and by reducing oxygen vacancies is intrinsic (i-type) or substantially i-type. Therefore, a transistor using such an oxide semiconductor has a feature of very small off-state current. Furthermore, the band gap of the oxide semiconductor is 2 eV or more, preferably 2.5 eV or more, more preferably 3 eV or more. Accordingly, an oxide semiconductor film which is highly purified by sufficient reduction in the concentration of impurities such as moisture and hydrogen and reduction of oxygen vacancies enables the off-state current of a transistor to be small.

Specifically, less off-state current of a transistor in which a highly purified oxide semiconductor is used for a semiconductor film can be proved with various experiments. For example, even with an element size with a channel width of $1 \times 10^6$ μm and a channel length of 10 μm, properties of an off-state current of less than or equal to the measurement limit of a semiconductor parameter analyzer, that is, less than or equal to $1 \times 10^{-13}$ A at a voltage (drain voltage) between a source terminal and a drain terminal in the range from 1 V to 10 V can be obtained. In that case, it can be found that the off-state current corresponding to a value obtained by dividing the off-state current by the channel width of the transistor is 100 zA/μm or less. In addition, the off-state current was measured using a circuit in which a capacitor and a transistor are connected to each other and charge which flows into or from the capacitor is controlled by the transistor. In the measurement, a highly purified oxide semiconductor film was used for a channel formation region of the transistor, and the off-state current of the transistor was measured from a change in the amount of charge of the capacitor per unit time. As a result, it was found that a lower off-state current of several tens of yoctoamperes per micrometer (yA/μm) is obtained at a drain voltage of 3 V. Thus, a transistor whose channel formation region is formed in a highly purified oxide semiconductor film has much smaller off-state current than a transistor using crystalline silicon.

Unless otherwise specified, in the case of an n-channel transistor, the "off-state current" in this specification is a current which flows between the source terminal and the drain terminal at a potential of the gate electrode of 0 or less relative to the potential of the source terminal in the state where the potential of the drain terminal is greater than that either of the source terminal or the gate electrode. Further, in the case of a p-channel transistor, the "off-state current" in this specification is a current which flows between the source terminal and the drain terminal at a potential of the gate electrode of 0 or more relative to the potential of the source terminal in the state where the potential of the drain terminal is less than that either of the source terminal or the gate electrode.

For example, the oxide semiconductor film can be formed by a sputtering method using a target including indium (In), gallium (Ga), and zinc (Zn). In the case of forming an In—Ga—Zn-based oxide semiconductor film by a sputtering method, it is preferable to use a target of an In—Ga—Zn-based oxide having an atomic ratio of In:Ga:Zn=1:1:1, 4:2:3, 3:1:2, 1:1:2, 2:1:3, or 3:1:4. A polycrystal or a c-axis aligned crystal (CAAC) is more likely to be formed by forming an oxide semiconductor film with use of a target of an In—Ga—Zn-based oxide having such an atomic ratio. Further, the relative density of the target including In, Ga, and Zn is greater than or equal to 90% and less than or equal to 100%, preferably greater than or equal to 95% and less than 100%. The target with such a high relative density enables a dense oxide semiconductor film to be formed.

In the case where an In—Zn-based oxide is used as an oxide semiconductor, a target therefor has an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$: ZnO=15:2 to 3:4 in a molar ratio). For example, in a target used for formation of an oxide semiconductor film including an In—Zn-based oxide, the relation of Z>1.5X+Y is satisfied where the atomic ratio is In:Zn:O=X:Y:Z. The mobility can be improved by keeping the ratio of Zn within the above range.

The oxide semiconductor film is single crystal, polycrystalline (also referred to as a polycrystal), amorphous, or the like.

The oxide semiconductor film is preferably a CAAC-OS (c-axis aligned crystalline oxide semiconductor) film.

The CAAC-OS film is neither completely single crystal nor completely amorphous. The CAAC-OS film is an oxide semiconductor film with a crystal-amorphous mixed phase structure where crystal parts are included in an amorphous phase. In most cases, the size of the crystal part fits inside a cube whose one side is less than 100 nm. Further, from an observation image obtained with a transmission electron microscope (TEM), a boundary between the amorphous part and the crystal part in the CAAC-OS film is not clear. In addition, with the TEM, a grain boundary in the CAAC-OS film is not found. Thus, in the CAAC-OS film, reduction in electron mobility attributed to the grain boundary is suppressed.

In each of the crystal parts included in the CAAC-OS film, the c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Among the crystal parts, both or either of the directions of the a-axis and the b-axis may be different. In this specification, being just "perpendicular" means being in a range from 85° to 95°. In addition, being just "parallel" means being in a range from −5° to 5°.

In the CAAC-OS film, distribution of crystal parts is not necessarily uniform. For example, in the formation process of the CAAC-OS film, in the case where crystal growth proceeds from a surface side of the oxide semiconductor film, the proportion of crystal parts in the vicinity of the surface of the oxide semiconductor film is, in some cases, higher than that in the vicinity of the surface where the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor attributed to irradiation with visible light or ultraviolet light can be reduced. Thus, the transistor has high reliability.

For example, the CAAC-OS film is formed by a sputtering method with a polycrystalline oxide semiconductor sputtering target. When ions collide with the sputtering target, a crystal region included in the sputtering target may be cleaved along the a-b plane, so that a flat-plate-like or pellet-like sputtered particle having a plane parallel to the a-b plane may be separated from the sputtering target. In that case, the flat-plate-like sputtered particle reaches a substrate while maintaining their crystal state, whereby the CAAC-OS film can be formed.

For the formation of the CAAC-OS film, the following conditions are preferably used.

By reducing the amount of impurities entering the CAAC-OS film during the formation, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Further, by increasing the substrate heating temperature during the film formation, migration of a sputtered particle occurs after the sputtered particle reaches a substrate. Specifically, the substrate heating temperature during the film formation is higher than or equal to 100° C. and lower than or equal to 740° C., preferably higher than or equal to 200° C. and lower than or equal to 500° C. By increasing the substrate heating temperature during the film formation, when a flat-plate-like sputtered particle reaches the substrate, migration occurs on the substrate, so that a flat plane of the flat-plate-like sputtered particle is attached to the substrate.

Furthermore, it is preferable that the proportion of oxygen in the deposition gas be high and the power be optimized in order to reduce plasma damage at the film formation. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure thereto, and performing heat treatment at a temperature higher than or equal to 1000° C. and lower than or equal to 1500° C. Note that X, Y, and Z are given positive numbers. Here, the predetermined molar ratio of $InO_X$ powder to $GaO_Y$ powder to $ZnO_Z$ powder is, for example, 2:2:1, 8:4:3, 3:1:1, 1:1:1, 4:2:3, or 3:1:2. The kinds of powder and the molar ratio for mixing powder may be tailored to the sputtering target.

This embodiment can be implemented combining with another embodiment as appropriate.

Embodiment 5

In this embodiment, an example of a panel that corresponds to one embodiment of a semiconductor display device is described. A panel illustrated in FIG. 12 includes a substrate 700, and a pixel portion 701, a signal line driver circuit 702a, a signal line driver circuit 702b, a scan line driver circuit 703a, and a scan line driver circuit 703b over the substrate 700.

The pixel portion 701 includes a plurality of pixels. Each pixel includes a display element and one or more transistors for controlling an operation of the display element. The scan line driver circuit 703a and the scan line driver circuit 703b supply potentials to scan lines connected to pixels to select pixels in the pixel portion 701. The signal line driver circuits 702a and 702b control supplies of image signals to the pixels selected by the scan line driver circuits 703a and 703b.

Figure 12:
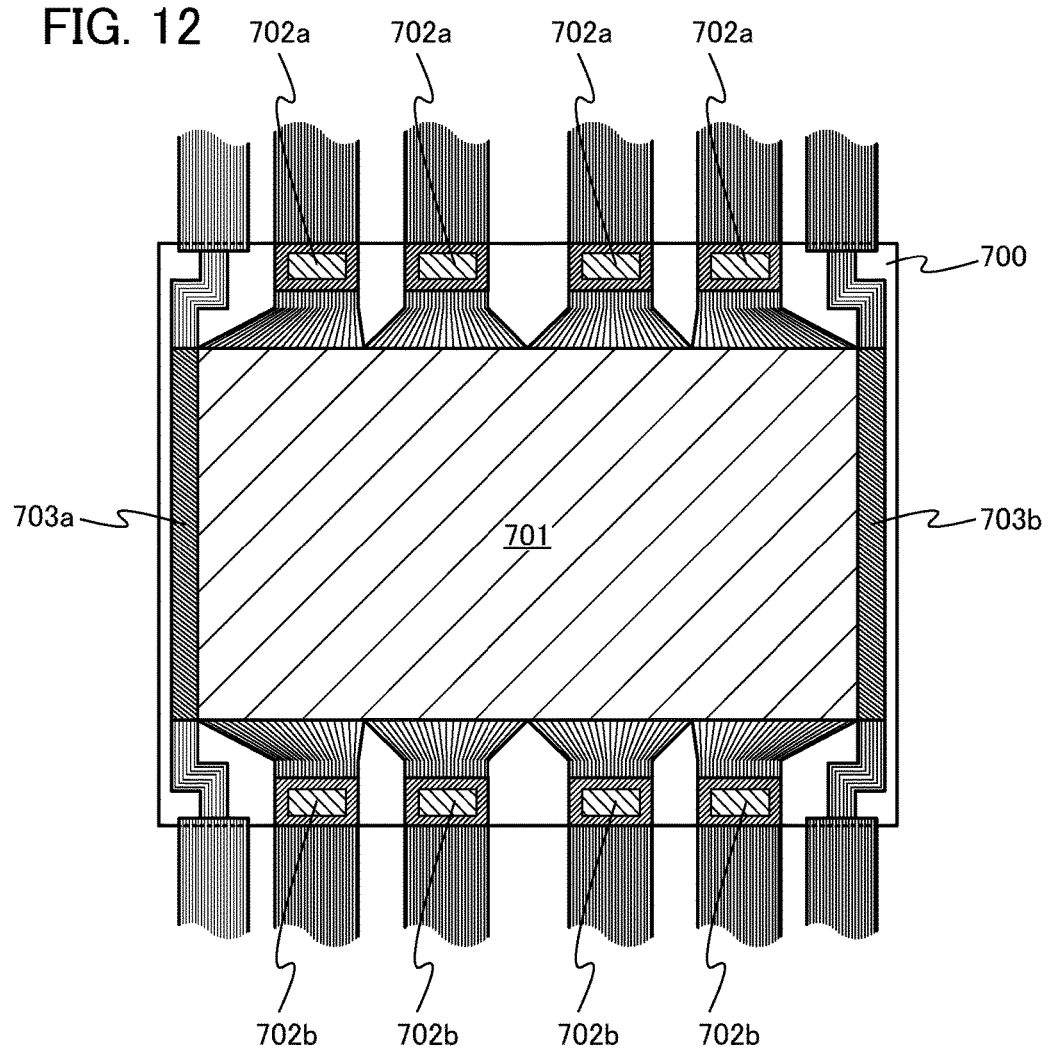
FIG. 12 is a diagram illustrating a structure of a panel.

Illustrated in FIG. 12 is a case where a potential is supplied to the scan line from both sides of the pixel portion 701 by the scan line driver circuits 703a and 703b. This structure enables a potential drop attributed to a wiring resistance of the scan line in the pixel portion 701 to be prevented even if the scan line is lengthened by an increase in the size of the pixel portion 701.

The signal line driver circuits 702a and 702b supply image signals to the pixels through signal lines. In FIG. 12, image signals are supplied to the pixels through odd-number-th signal lines by the signal line driver circuit 702a, and through even-number-th signal lines by the signal line driver circuit 702b.

In FIG. 12, a case where the scan line driver circuits 703a and 703b are, together with the pixel portion 701, formed over the substrate 700, and the signal line driver circuits 702a and 702b are each formed on a chip and then mounted on the substrate 700 by a tape automated bonding (TAB) method is described. Alternatively, the scan line driver circuits 703a and 703b each may be formed on a chip and then mounted on the substrate 700, and the signal line driver circuits 702a and 702b may be, together with the pixel portion 701, formed over the substrate 700. Further, the method of bonding the chip is not limited to the TAB method. The chip may be mounted on the substrate 700 by a flexible printed circuit (FPC) or the like, or instead may be mounted on the substrate 700 by a chip on film (COF) method.

Since the scan lines are connected to a plurality of pixels, the requisite current supply ability of each of the scan line driver circuits 703a and 703b is high. Therefore, each transistor positioned on an output side of a pulse output circuit included in the scan line driver circuits 703a and 703b needs to have a large size. In particular, in the case where the number of pixels in the pixel portion 701 is increased or the area of the pixel portion 701 is increased, the wiring resistance of the scan lines or the load connected to the scan lines increases, which makes it necessary to further increase the size of the above-described transistor to meet a higher current supply ability. Such an increase in the size of the above-described transistor accompanies an increase in the area of a conductive film functioning as gate electrodes of a plurality of transistors in the scan line driver circuit 703a, 703b, resulting in an increase in the probability of occurrence of electrostatic destruction of the above-described wiring attributed to an antenna effect. However, in one embodiment of the present invention, the plurality of gate electrodes are electrically connected to each other by a conductive film provided in a layer different from the gate electrodes; accordingly, the are of each conductive film functioning as a gate electrode can be suppressed to be small, so that electrostatic destruction attributed to an antenna effect can be less likely to occur even if the number of pixels in the pixel portion 701 is increased or the area of the pixel portion 701 is increased.

Although a case where the structure according to one embodiment of the present invention is applied to the scan line driver circuit 703a, 703b is described in this embodiment, the structure according to one embodiment of the present invention may also be applied to the signal line driver circuit 702a, 702b.

This embodiment can be implemented combining with another embodiment as appropriate.

Embodiment 6

A semiconductor device according to one embodiment of the present invention can be applied to display devices, personal computers, or image reproducing devices provided with recording media (typically devices which reproduce the content of recording media such as DVDs (digital versatile discs) and have displays for displaying the reproduced images). Other than the above, as examples of an electronic device which can use the semiconductor device according to one embodiment of the present invention, mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 13A to 13E illustrate specific examples of these electronic devices.

Figure 13A:
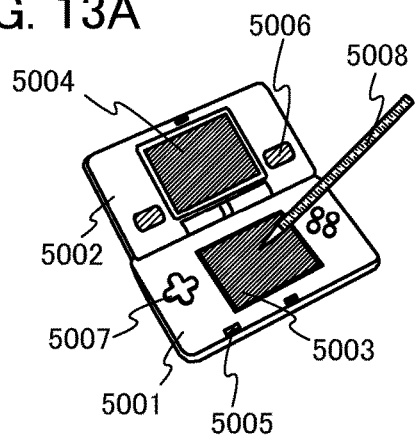
FIGS. 13A to 13E are diagrams each illustrating an electronic device.

FIG. 13A illustrates a portable game machine including a housing 5001, a housing 5002, a display portion 5003, a display portion 5004, a microphone 5005, a speaker 5006, an operation key 5007, a stylus 5008, and the like. The semiconductor device according to one embodiment of the present invention can be applied to a driver circuit or the display portion(s) 5003 and/or 5004 of the portable game machine, enabling the portable game machine to be provided with a high yield. Although the portable game machine illustrated in FIG. 13A includes the two display portions 5003 and 5004, the number of display portions included in the portable game machine is not limited to two.

Figure 13B:
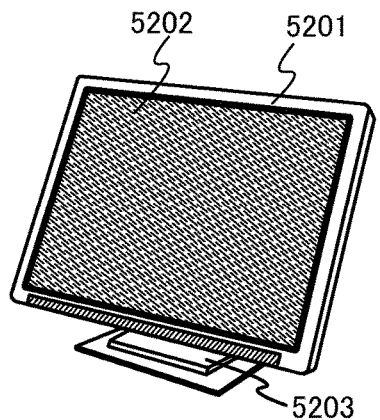

FIG. 13B illustrates a display device including a housing 5201, a display portion 5202, a support base 5203, and the like. The semiconductor device according to one embodiment of the present invention can be applied to a driver circuit or the display portion 5202 of the display device, enabling the display device to be provided with a high yield. The display device includes in its category, any display device for displaying information, such as display devices for personal computers, TV broadcast reception, and advertisement.

Figure 13C:
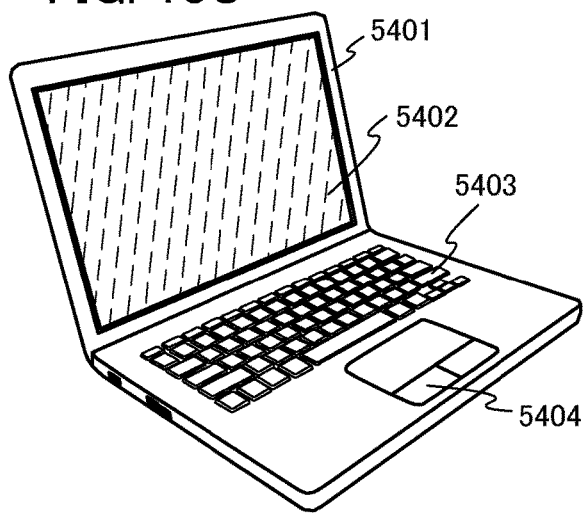

FIG. 13C illustrates a laptop personal computer including a bezel 5401, a display portion 5402, a keyboard 5403, a pointing device 5404, and the like. The semiconductor device according to one embodiment of the present invention can be applied to a driver circuit or the display portion 5402 of the laptop personal computer, enabling the laptop personal computer to be provided with a high yield.

Figure 13D:
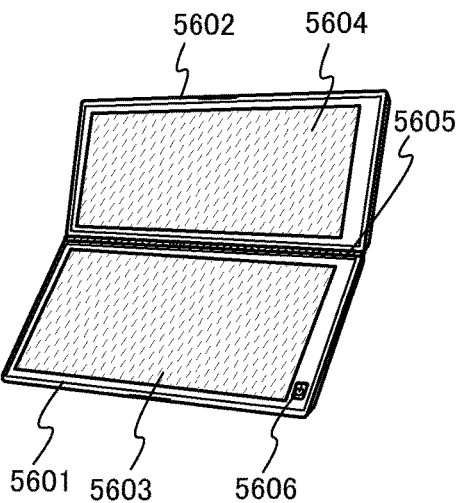

FIG. 13D illustrates a portable information terminal including a first housing 5601, a second housing 5602, a first display portion 5603, a second display portion 5604, a joint 5605, an operation key 5606, and the like. The first display portion 5603 is provided for the first housing 5601, and the second display portion 5604 is provided for the second housing 5602. The first housing 5601 and the second housing 5602 are connected to each other with the joint 5605 such that an angle between the first housing 5601 and the second housing 5602 can be changed with the joint 5605. An image on the first display portion 5603 may be switched depending on the angle between the first housing 5601 and the second housing 5602 at the joint 5605. A semiconductor display device with a position input function may be used as at least one of the first display portion 5603 and the second display portion 5604. Such a position input function can be provided by providing a touch panel for the semiconductor display device. The position input function can also be provided by providing a photoelectric conversion element called a photosensor in a pixel portion of the semiconductor display device. The semiconductor device according to one embodiment of the present invention can be applied to a driver circuit or the first display portion 5603 and/or the second display portion 5604 of the portable information terminal, enabling the portable information terminal to be provided with a high yield.

Figure 13E:
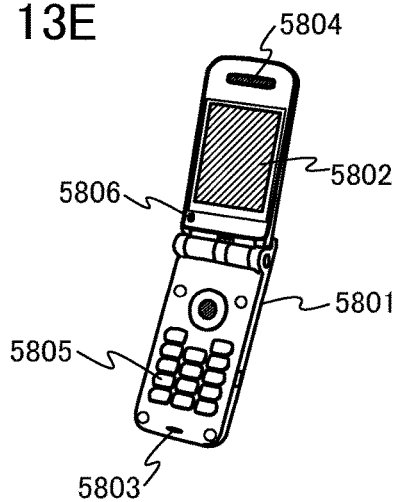

FIG. 13E illustrates a mobile phone including a housing 5801, a display portion 5802, an audio input portion 5803, an audio output portion 5804, operation keys 5805, a light-receiving portion 5806, and the like. Light received in the light-receiving portion 5806 is converted into electrical signals, whereby external images can be loaded. The semiconductor device according to one embodiment of the present invention can be applied to a driver circuit or the display portion 5802 of the mobile phone, enabling the mobile phone to be provided with a high yield.

This embodiment can be implemented combining with another embodiment as appropriate.

This application is based on Japanese Patent Application serial no. 2011-222990 filed with Japan Patent Office on Oct. 7, 2011, the entire contents of which are hereby incorporated by reference.

What is claimed is:
1. A semiconductor device comprising:
a first transistor;
a second transistor;
a third transistor;
a fourth transistor;
a fifth transistor;
a sixth transistor;
a seventh transistor;
an eighth transistor; and
a ninth transistor,
wherein:
the first transistor, the second transistor, the third transistor, the fourth transistor, the fifth transistor, the sixth transistor, the seventh transistor, the eighth transistor, and the ninth transistor have a same conductivity type;
one of a source and a drain of the first transistor is electrically connected to a first wiring;
the other of the source and the drain of the first transistor is electrically connected to a second wiring;
one of a source and a drain of the second transistor is electrically connected to the second wiring;
the other of the source and the drain of the second transistor is electrically connected to a third wiring;
one of a source and a drain of the third transistor is electrically connected to a fourth wiring;
the other of the source and the drain of the third transistor is electrically connected to one of a source and a drain of the fourth transistor;
the other of the source and the drain of the fourth transistor is electrically connected to a fifth wiring;
one of a source and a drain of the fifth transistor is electrically connected to the fourth wiring;
the other of the source and the drain of the fifth transistor is electrically connected to a gate of the first transistor;
one of a source and a drain of the sixth transistor is electrically connected to the fourth wiring;
the other of the source and the drain of the sixth transistor is electrically connected to one of a source and a drain of the seventh transistor;
a gate of the sixth transistor is electrically connected to the gate of the first transistor;
a gate of the seventh transistor is electrically connected to the other of the source and the drain of the third transistor;
one of a source and a drain of the eighth transistor is electrically connected to the fourth wiring;
the other of the source and the drain of the eighth transistor is electrically connected to one of a source and a drain of the ninth transistor;
the other of the source and the drain of the ninth transistor is electrically connected to a sixth wiring;
a first conductive layer is electrically connected to a third conductive layer through a second conductive layer;
the first conductive layer is configured to be the gate of the first transistor;
the third conductive layer is configured to be a gate of the third transistor, and
the second wiring is configured to transmit a signal being output from a circuit comprising the first transistor, the second transistor, the third transistor, the fourth transistor, the fifth transistor, the sixth transistor, the seventh transistor, the eighth transistor, and the ninth transistor.

2. The semiconductor device according to claim 1, wherein:
the second conductive layer and a fourth conductive layer are provided in a same layer; and
the fourth conductive layer is configured to be the one of the source and the drain of the first transistor.

3. A semiconductor device comprising:
a first transistor;
a second transistor;
a third transistor;
a fourth transistor;
a fifth transistor;
a sixth transistor;
a seventh transistor;
an eighth transistor; and
a ninth transistor,
wherein:
the first transistor, the second transistor, the third transistor, the fourth transistor, the fifth transistor, the sixth transistor, the seventh transistor, the eighth transistor, and the ninth transistor have a same conductivity type;
one of a source and a drain of the first transistor is electrically connected to a first wiring;
the other of the source and the drain of the first transistor is electrically connected to a second wiring;
one of a source and a drain of the second transistor is electrically connected to the second wiring;
the other of the source and the drain of the second transistor is electrically connected to a third wiring;
one of a source and a drain of the third transistor is electrically connected to a fourth wiring;
the other of the source and the drain of the third transistor is electrically connected to one of a source and a drain of the fourth transistor;

the other of the source and the drain of the fourth transistor is electrically connected to a fifth wiring;
one of a source and a drain of the fifth transistor is electrically connected to the fourth wiring;
the other of the source and the drain of the fifth transistor is electrically connected to a gate of the first transistor;
one of a source and a drain of the sixth transistor is electrically connected to the fourth wiring;
the other of the source and the drain of the sixth transistor is electrically connected to one of a source and a drain of the seventh transistor;
a gate of the sixth transistor is electrically connected to the gate of the first transistor;
a gate of the seventh transistor is electrically connected to the other of the source and the drain of the third transistor;
one of a source and a drain of the eighth transistor is electrically connected to the fourth wiring;
the other of the source and the drain of the eighth transistor is electrically connected to one of a source and a drain of the ninth transistor;
the other of the source and the drain of the ninth transistor is electrically connected to a sixth wiring;
a first conductive layer is electrically connected to a third conductive layer through a second conductive layer;
the first conductive layer is configured to be the gate of the first transistor;
the third conductive layer is configured to be a gate of the third transistor;
the second wiring is configured to transmit a signal being output from a circuit comprising the first transistor, the second transistor, the third transistor, the fourth transistor, the fifth transistor, the sixth transistor, the seventh transistor, the eighth transistor, and the ninth transistor, and
a ratio of a channel width of the first transistor to a channel length of the first transistor is larger than a ratio of a channel width of the first transistor to a channel length of the third transistor.

4. The semiconductor device according to claim 3, wherein:
the second conductive layer and a fourth conductive layer are provided in a same layer; and
the fourth conductive layer is configured to be the one of the source and the drain of the first transistor.

5. A semiconductor device comprising:
a first transistor;
a second transistor;
a third transistor;
a fourth transistor;
a fifth transistor;
a sixth transistor;
a seventh transistor;
an eighth transistor; and
a ninth transistor,
wherein:
the first transistor, the second transistor, the third transistor, the fourth transistor, the fifth transistor, the sixth transistor, the seventh transistor, the eighth transistor, and the ninth transistor have a same conductivity type;
one of a source and a drain of the first transistor is electrically connected to a first wiring;
the other of the source and the drain of the first transistor is electrically connected to a second wiring;
one of a source and a drain of the second transistor is electrically connected to the second wiring;
the other of the source and the drain of the second transistor is electrically connected to a third wiring;
one of a source and a drain of the third transistor is electrically connected to a fourth wiring;
the other of the source and the drain of the third transistor is electrically connected to one of a source and a drain of the fourth transistor;
the other of the source and the drain of the fourth transistor is electrically connected to a fifth wiring;
one of a source and a drain of the fifth transistor is electrically connected to the fourth wiring;
the other of the source and the drain of the fifth transistor is electrically connected to a gate of the first transistor;
one of a source and a drain of the sixth transistor is electrically connected to the fourth wiring;
the other of the source and the drain of the sixth transistor is electrically connected to one of a source and a drain of the seventh transistor;
a gate of the sixth transistor is electrically connected to the gate of the first transistor;
a gate of the seventh transistor is electrically connected to the other of the source and the drain of the third transistor;
one of a source and a drain of the eighth transistor is electrically connected to the fourth wiring;
the other of the source and the drain of the eighth transistor is electrically connected to one of a source and a drain of the ninth transistor;
the other of the source and the drain of the ninth transistor is electrically connected to a sixth wiring;
a first conductive layer is electrically connected to a third conductive layer through a second conductive layer;
the first conductive layer is configured to be the gate of the first transistor;
the third conductive layer is configured to be a gate of the third transistor;
the second wiring is configured to transmit a signal being output from a circuit comprising the first transistor, the second transistor, the third transistor, the fourth transistor, the fifth transistor, the sixth transistor, the seventh transistor, the eighth transistor, and the ninth transistor, and
the first conductive layer is constantly electrically connected to the third conductive layer.

6. The semiconductor device according to claim 5, wherein:
the second conductive layer and a fourth conductive layer are provided in a same layer; and
the fourth conductive layer is configured to be the one of the source and the drain of the first transistor.

* * * * *